(12) United States Patent
Hara et al.

(10) Patent No.: US 9,062,374 B2
(45) Date of Patent: Jun. 23, 2015

(54) METHOD FOR FILM FORMATION, APPARATUS FOR FILM FORMATION, AND COMPUTER-READABLE RECORDING MEDIUM

(75) Inventors: Masamichi Hara, Nirasaki (JP); Yasushi Mizusawa, Nirasaki (JP); Satoshi Taga, Nirasaki (JP); Atsushi Gomi, Nirasaki (JP); Tatsuo Hatano, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 716 days.

(21) Appl. No.: 12/933,979

(22) PCT Filed: Jan. 23, 2009

(86) PCT No.: PCT/JP2009/051088
§ 371 (c)(1),
(2), (4) Date: Dec. 14, 2010

(87) PCT Pub. No.: WO2009/119147
PCT Pub. Date: Oct. 1, 2009

(65) Prior Publication Data
US 2011/0092070 A1   Apr. 21, 2011

(30) Foreign Application Priority Data
Mar. 27, 2008  (JP) .................. 2008-084551

(51) Int. Cl.
C23C 16/16    (2006.01)
C23C 16/455   (2006.01)
H01L 21/285   (2006.01)

(52) U.S. Cl.
CPC .......... *C23C 16/45559* (2013.01); *C23C 16/16* (2013.01); *H01L 21/28562* (2013.01)

(58) Field of Classification Search
None
See application file for complete search history.

(56) References Cited

U.S. PATENT DOCUMENTS

| 5,919,332 | A | * | 7/1999 | Koshiishi et al. | ......... 156/345.47 |
| 5,972,116 | A | * | 10/1999 | Takagi | ........................ 118/719 |
| 2004/0099378 | A1 | * | 5/2004 | Kim et al. | ................. 156/345.33 |
| 2004/0194694 | A1 | * | 10/2004 | Sugiyama et al. | ............ 117/200 |
| 2005/0133161 | A1 | * | 6/2005 | Carpenter et al. | ....... 156/345.34 |

(Continued)

FOREIGN PATENT DOCUMENTS

| EP | 1464735 A2 | 10/2004 |
| JP | 6-224131 A | 8/1994 |

(Continued)

OTHER PUBLICATIONS

An Office Action dated Jan. 14, 2011, issued from the Japan Patent Office for Japanese Patent Application No. 2008-084551, and a partial English translation thereof.

(Continued)

*Primary Examiner* — Dah-Wei Yuan
*Assistant Examiner* — Charles Capozzi
(74) *Attorney, Agent, or Firm* — Abelman, Frayne & Schwab

(57) ABSTRACT

Disclosed is a method for film formation, comprising allowing a treatment gas stream containing a metal carbonyl-containing treatment gas and a carbon monoxide-containing carrier gas to flow into a region on the upper outside of the outer periphery of a substrate to be treated in a diameter direction of the substrate while avoiding the surface of the substrate and diffusing the metal carbonyl from the treatment gas stream into the surface of the substrate to form a metal film on the surface of the substrate.

12 Claims, 30 Drawing Sheets

(56) References Cited

U.S. PATENT DOCUMENTS

2006/0084266 A1    4/2006  Narushima et al.
2006/0130757 A1*   6/2006  Li .............................. 118/715
2007/0234955 A1   10/2007  Suzuki et al.

FOREIGN PATENT DOCUMENTS

| | | |
|---|---|---|
| JP | 2002-60944 A | 2/2002 |
| JP | 2004-311649 A | 11/2004 |
| JP | 2004-346401 A | 12/2004 |
| JP | 2005-353937 A | 12/2005 |
| JP | 2006-120713 A | 5/2006 |
| JP | 2007-211346 A | 8/2007 |
| JP | 2007-277719 A | 10/2007 |
| WO | 2006/057710 A1 | 6/2006 |

OTHER PUBLICATIONS

International Search Report for Japanese Application No. PCT/JP2009/051088 with English translation mailed Apr. 21, 2009.

* cited by examiner

FIG.5 *Prior Art*

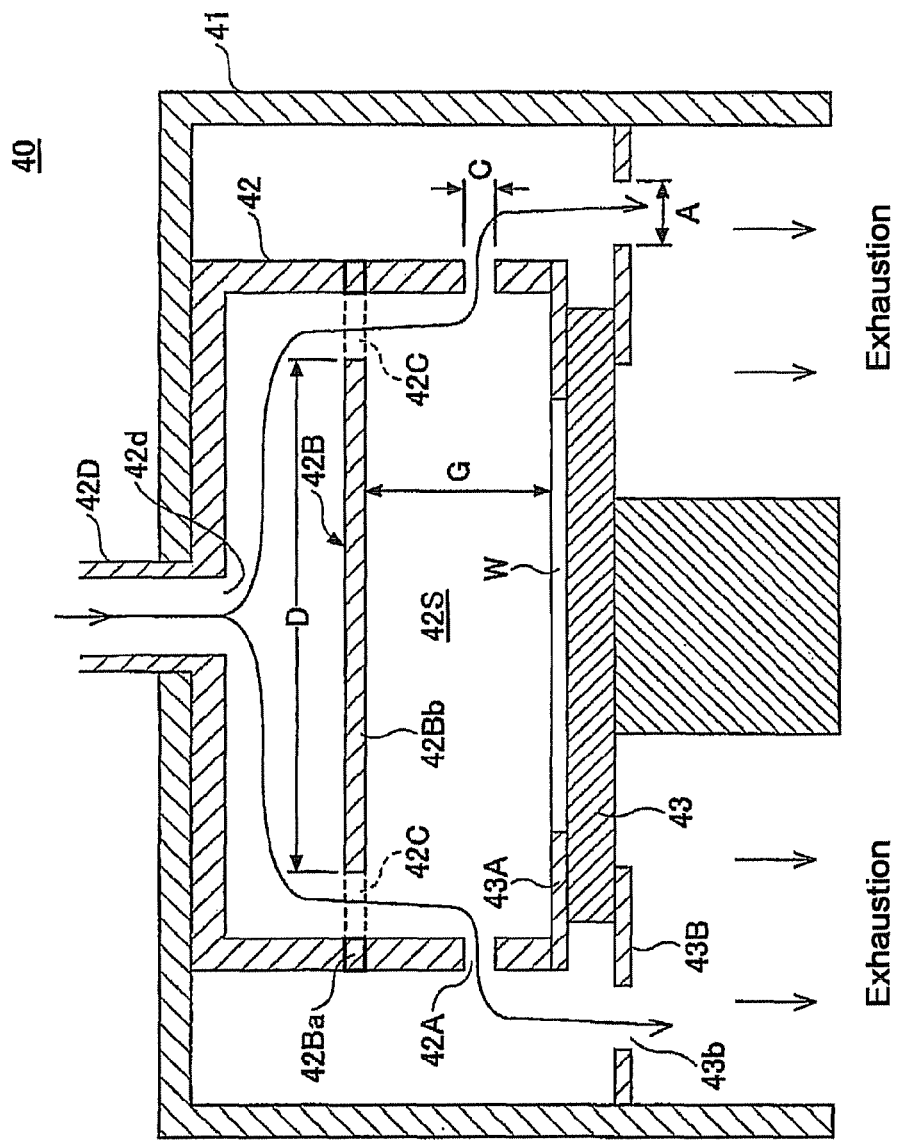

METHOD FOR FILM FORMATION, APPARATUS FOR FILM FORMATION, AND COMPUTER-READABLE RECORDING MEDIUM

CROSS REFERENCE TO RELATED APPLICATIONS

This is a U.S. national stage application of International Application No. PCT/JP2009/051088, filed on 23 Jan. 2009. Priority under 35 U.S.C. §119(a) and 35 U.S.C. §365(b) is claimed from Japanese Application No. JP2008-084551, filed 27 Mar. 2008, the disclosure of which is also incorporated herein by reference.

TECHNICAL FIELD

The present invention generally relates to a manufacturing of a semiconductor device, specifically, to a method for a film formation by the decomposition of a gas-state base material and a film forming apparatus.

BACKGROUND

In today's semiconductor integrated circuits, the diameter of the via plug formed with copper (Cu) inside of an insulating film between layers is reduced from 65 nm to 45 nm along with the miniaturization. It is expected that the diameter of the via plug will be further reduced to 32 nm or 22 nm in recent future.

As the semiconductor integrated circuits are miniaturized, it is difficult to form a barrier metal film or a Cu seed layer by the conventional PVD method in a miniaturized via hale or a wiring groove in view of the step coverage. Accordingly, a film forming technology by the MOCVD method or the ALD method is studied in which an improved step coverage can be realized at a low temperature that does not damage the insulating film between layers formed with a low dielectric material (low-K material).

However, the MOCVD method and the ALD method generally use an organic metal as a base material where metal atoms are combined with an organic group. As a result, impurities tend to reside in the formed film, and thus, the quality of the film is not stable even if the step coverage looks satisfactory. For example, when a Cu seed layer is formed on a metal film of Ta barrier by the MOCVD method, the formed Cu seed layer tends to generate a condensation thereby making it difficult to form a Cu seed layer that stably covers the Ta barrier film with a uniform film thickness. When an electrolysis plating is performed using the seed layer that generated the condensation as an electrode, potential defects may be included in the Cu layer charged at the wiring groove or the via hole. As a result, problem occurs such as the increase of the electric resistance as well as the electro-migration tolerance or a deterioration of the stress-migration tolerance.

Thus, a method has been recently suggested where a barrier metal film or a Cu seed layer is formed directly on the insulating film between layers by the MOCVD technology of a metal film using a metal carbonyl base material. Metal carbonyl base material is readily dissociated at a relatively low temperature to form a metal layer, and the CO, which is the ligand of metal carbonyl base material, does not reside in the formed film and immediately discharged to outside of the film forming reaction system. As a result, the barrier metal film or the Cu seed layer can be formed with a good quality having extremely low impurities. Using this method, a W film can be formed using, for example, $W(C)_6$, as a barrier metal layer, or a ruthenium (Ru) film can be formed using, for example, $Ru_3(CO)_{12}$, as the Cu seed layer.

SUMMARY

Problems to be Solved by the Invention

In the mean time, since the metal carbonyl base material has a characteristic that can be easily dissociated at a relatively low temperature, a technology has been proposed where the carbon monoxide gas is supplied as a carrier gas to suppress the dissociation of the base material during the transport of the base material (base material supply system). It is known that the carbon monoxide has an effect to suppress the dissociation.

For example, in the technology that forms an Ru film as a Cu seed film, Ru carbonyl base material such as $Ru_3(CO)_{12}$ is supplied to the base material supply system using CO gas as a carrier gas to suppress the dissociation of the Ru carbonyl base material during the transport procedure.

FIG. 1 illustrates the constitution of a film forming apparatus 10, according to the above-described relevant technology.

Referring to FIG. 1, film forming apparatus 10 is exhausted by an exhaust system 11, and includes a processing chamber 12 equipped with a substrate holding plate 13 that holds a substrate to be processed W. A gate valve 12G is formed at process chamber 12 allowing the substrate to be processed W passes through.

A heater is embedded in substrate holding plate 13, and the substrate to be processed W is maintained at a desired process temperature by driving the heater through a driving line 13A.

Exhaust system 11 is formed with a turbo molecular pump 11A and a dry pump 11B connected serially, and nitrogen gas is supplied to turbo molecular pump 11A via a valve 11b. A variable conductance valve 11a is provided between process chamber 12 and turbo molecular pump 11A to maintain the entire pressure of process chamber 12 being constant. Also, in film forming apparatus 10 of FIG. 1, an exhaustion path 11C is provided configured to bypass turbo molecular pump 11A for a rough vacuum of process chamber 12 by dry pump 11B, a valve 11c is provided in exhaustion path 11C and another valve 11d is provided at the downstream side of turbo molecular pump 11A.

In process chamber 12, a film forming base material is supplied with a gas state via a gas introducing line 14B from a base material supply system 14 that includes a base material container 14A.

In the illustrated embodiment, $Ru_3(CO)_{12}$ which is the carbonyl compound of Ru is maintained in base material container 14A, and the CO gas is provided as a carrier gas via bubble ring gas line 14a that includes MFC (a mass flow controller). As a result, evaporated $Ru_3(CO)_{12}$ raw gas is supplied to process chamber 12 as a carrier gas that contains the raw gas and CO carrier gas via gas introduce line 14B and shower head 14S, along with the CO carrier gas from line 14d that includes line MFC 14c.

Also, in the constitution of FIG. 1, along with valves 14g, 14h and MFC 14e, a line 14f is provided that supplies inert gas such as Ar, and the inert gas is added to $Ru_3(CO)_{12}$ raw gas supplied to process chamber 12 via line 14B.

Also, in film forming apparatus 10, a controller 10A is provided to control process chamber 12, exhaust system 11 and base material supply system 14.

Also, the formation of Ru film on the substrate to be processed W is performed by $Ru_3(CO)_{12} \rightarrow 3Ru + 12CO$ which is the dissociation reaction of the $Ru_3(CO)_{12}$ base material.

The reaction proceeds toward the right side when the partial pressure of the CO gas existing in the film forming reaction system is low. As a result, the reaction proceeds instantly as soon as the CO gas is exhausted outside of process chamber 12 thereby deteriorating the step coverage of the formed film. Due to this, the inside of process chamber 12 is maintained with a high concentration CO gas atmosphere to prevent an excessive reaction of the dissociation (Patent Literature 2).

However, the inventor of the present invention discovered that when film forming apparatus 10 having a conventional shower head 14S is used as shown in FIG. 1, the deposition rate of the Ru film becomes non-uniform on the substrate W to be processed as shown in FIG. 2. More specifically, the deposition rate is higher at the center of the substrate than the periphery portion so that a distribution profile is generated regarding the deposition rate in the surface. Accordingly, as shown in FIG. 3, it has been discovered that the Ru film formed on the substrate to be processed W has a film thickness profile in which the thickness is thicker at the center of the substrate to be processed W and thinner at the periphery portion, and the variation of the film thickness in the surface reaches up to 15%.

It is noted that the results of FIG. 2 and FIG. 3 are based on a case where an approximately cylindrical processing chamber having an inner diameter of 505 mm is used as process chamber 12, a silicon wafer W having a diameter of 300 mm is held on substrate holding plate 13 as the substrate to be processed W, the distance between shower head 14S and the substrate to be processed W is set to be 18 mm, $Ru_3(CO)_{12}$ gas is supplied with a flow rate of 1 sccm~2 sccm as a source gas along with CO carrier gas with a flow rate of 100 sccm, and the Ru film is formed at 190° C. of substrate temperature.

Therefore, a technology is required to suppress the deposition rate distribution profile in the surface or film thickness distribution profile in the surface.
Patent Literature 1: Japanese Laid-Open 2002-60944
Patent Literature 2: Japanese Laid-Open 2004-30401

Means to Solve the Problems

According to an aspect, the present invention provides a film forming method characterized by forming a metal film on the surface of the substrate to be processed. In the method, a process gas including a raw gas containing metal carbonyl and a carrier gas containing carbon-monoxide flows to the region of an upper-outer side of the diameter direction than the outer periphery of the substrate to be processed while avoiding the surface of the substrate to be processed, and the metal carbonyl is diffused into the surface of the substrate to be processed by the flow of the process gas to form the metal film.

According to another aspect, the present invention provides a film forming apparatus characterized by including a substrate holding plate that supports a substrate to be processed, a process chamber that defines a process space along with the substrate holding plate, and an exhaust system that exhaust the process space at the upper-outer side of the diameter direction of the substrate holding plate. The film forming apparatus further includes a process gas supply unit provided at the process chamber to face the substrate holding plate to supply the process gas formed with the raw gas and carrier gas to the process space. In particular, a process gas introduce unit is provided at the process gas supply unit in such a way that the process gas flows at the upper-outer side of the diameter direction than the substrate to be processed on the substrate holding plate when the substrate holding plate is viewed from a vertical direction, to the exhaust system in the process space while avoiding the substrate to be processed.

According to yet another aspect, the present invention provides a computer-readable medium characterized by storing the software that, when executed by a general purpose computer, controls a film forming apparatus. The film forming apparatus includes a substrate holding plate that supports a substrate to be processed, a process chamber that defines a process space along with the substrate holding plate, and an exhaust system that exhaust the process space at the upper-outer side of the diameter direction of the substrate holding plate. The film forming apparatus further includes a process gas supply unit provided at the process chamber to face the substrate holding plate to supply the process gas formed with the raw gas and the carrier gas to the process space. In particular, a process gas introduce unit is provided at the process gas supply unit in such a way that the process gas flows at the upper-outer side of diameter direction than the substrate to be processed on the substrate holding plate when the substrate holding plate is viewed from a vertical direction, to the exhaust system in the process space while avoiding the substrate to be processed. Moreover, the process gas supply unit is provided with metal carbonyl base material as the process gas and carbon-monoxide as a carrier gas, and the general purpose computer controls the temperature of the substrate holding plate to be lower than the temperature at which the carbon-monoxide suppresses the dissociation of the metal carbonyl.

Effects of the Invention

According to the present invention, it is possible to suppress the thickness variation of the formed film in the surface by flowing the process gas which includes a process gas and a carrier gas to the space of an upper-outer side of the diameter direction than the outer periphery of the substrate to be processed while avoiding the substrate to be processed, and performing the film formation on the surface of the substrate to be processed by diffusing the chemical species of the process gas into the surface of the substrate to be processed from the flow of the process gas.

BRIEF DESCRIPTION OF THE DRAWINGS

FIG. 11a is a schematic diagram of a film forming apparatus according to a first embodiment of the present invention.

FIG. 12b is a graph explaining the measurement of FIG. 12a.

DETAILED DESCRIPTION OF EMBODIMENTS

Figure 1:
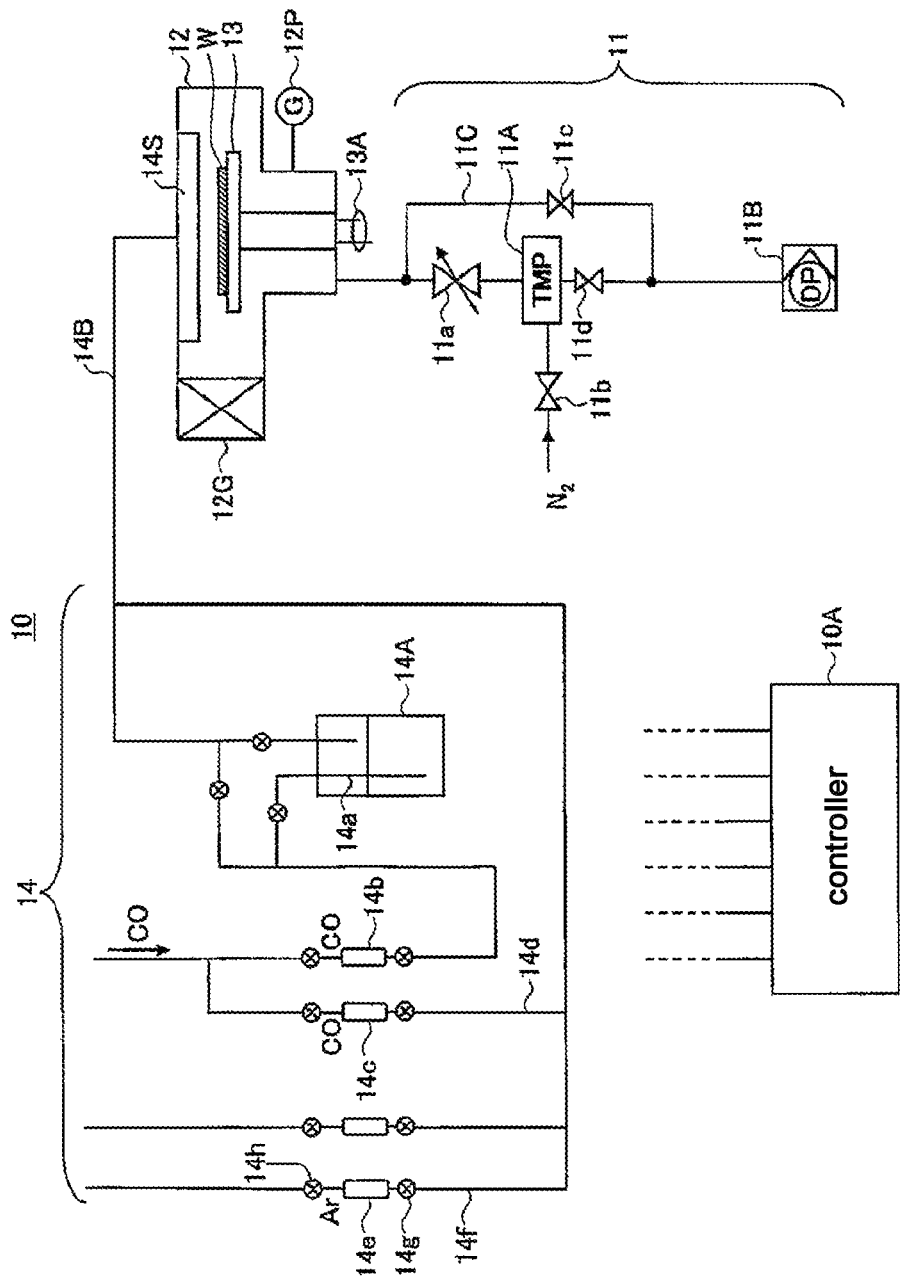
FIG. 1 is a schematic diagram of a CVD apparatus having a shower head used for a conventional film forming of an Ru film.
Figure 2:
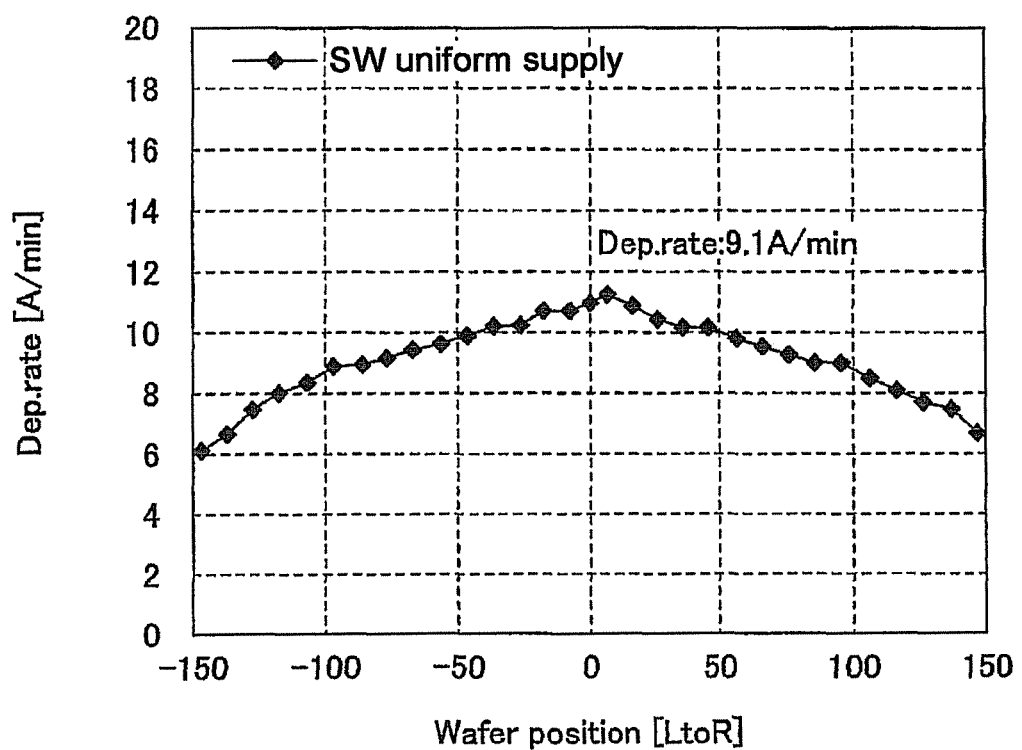
FIG. 2 is a graph that explains the project of the present invention.
Figure 3:
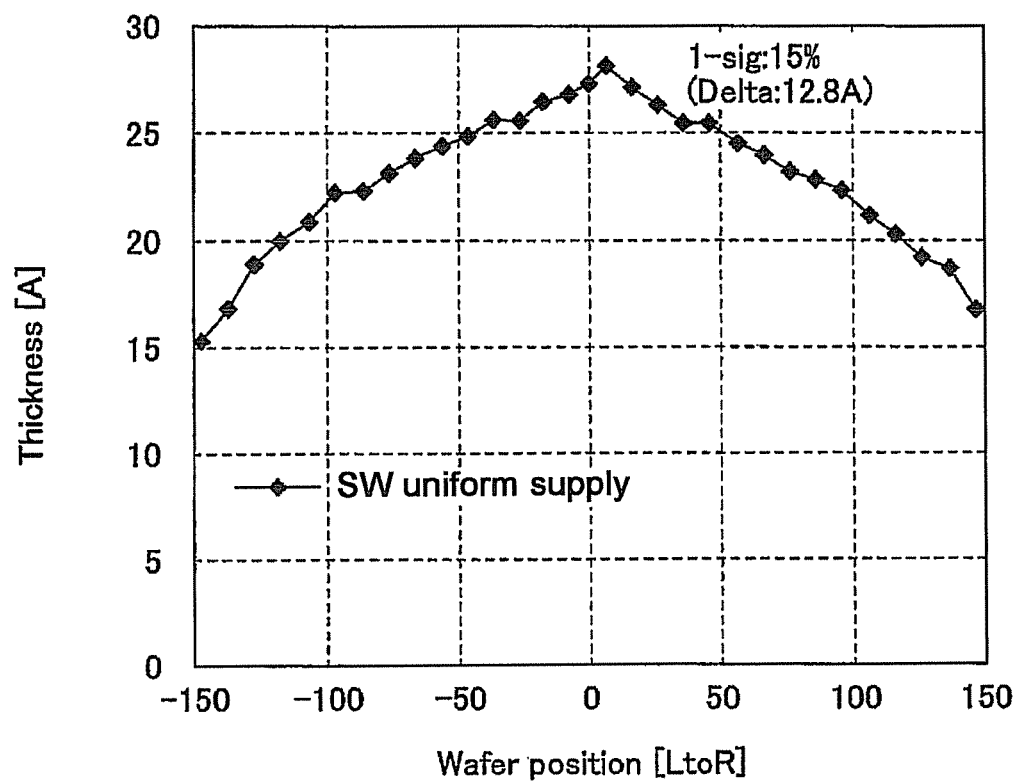
FIG. 3 is a graph that explains the project of the present invention.

Inventors of the present invention investigated, as a research on which the present invention is based, the cause of the non-uniformity of the deposition rate and film thickness in the surface as shown in FIG. 2 or FIG. 3 in film forming apparatus 10 using the shower head illustrated in FIG. 1 by examining the moving fluid speed simulation, and obtained the following information.

Figure 4:
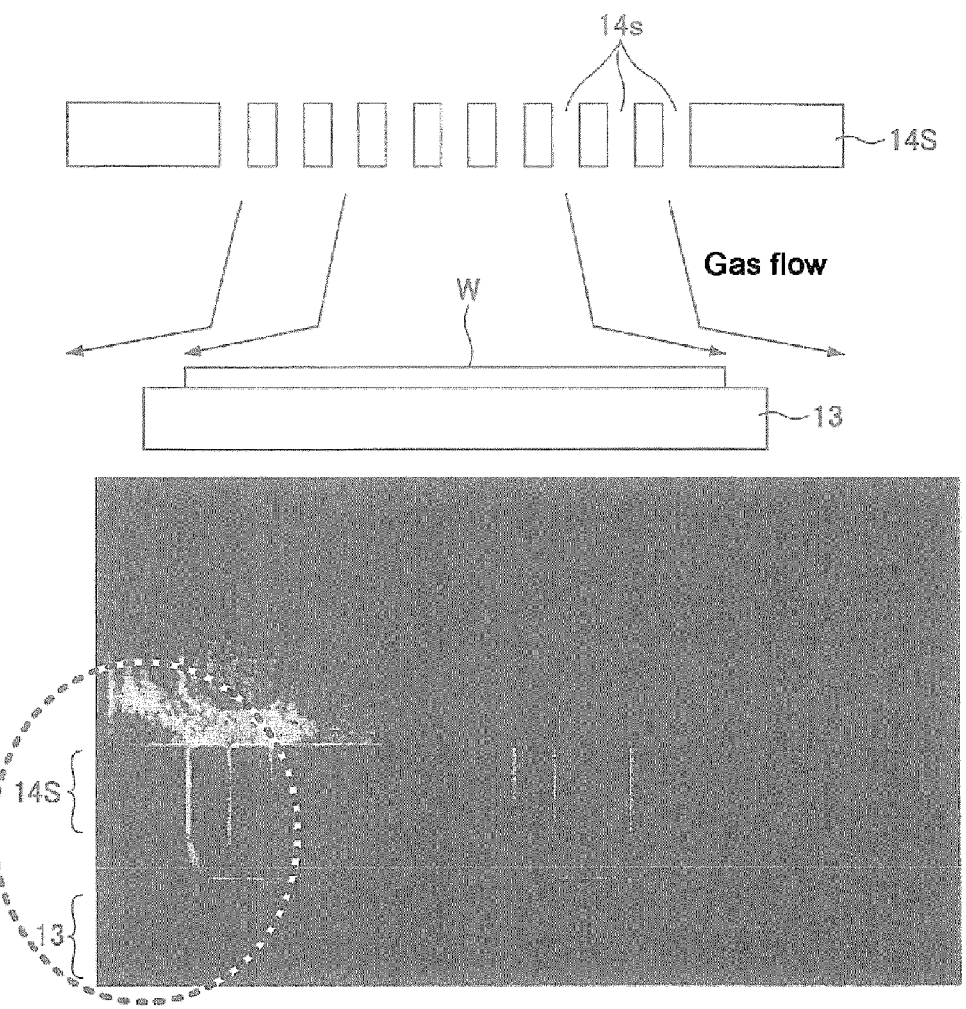
FIG. 4 illustrates a conventional film formation of the Ru film using the shower head.

FIG. 4 illustrates the simulation results of the moving fluid speed distribution of the process gas flow that occurs in the process space between shower head 14S and the substrate to be processed W when the Ru film is deposited by film forming apparatus 10 of FIG. 1 by supplying the process gas mentioned above from the shower head to the surface of the substrate to be processed using the conventional shower head having the same discharge holes formed at a surface that faces the substrate to be processed while exhausting from the exhausting system formed at the outer periphery of substrate holding plate 13. Also, in the simulation results of FIG. 4, the lighter portion represents the gas concentration, and, accordingly represents the portion where the pressure is high. In FIG. 4, while the gas flow rate at each point is represented as a tiny arrow, the process gas pressure and the distribution of the moving fluid speed in the surface of the substrate to be processed W are represented as a graph in FIG. 5 since it is difficult to represent in FIG. 4 due to the resolution.

Figure 5:
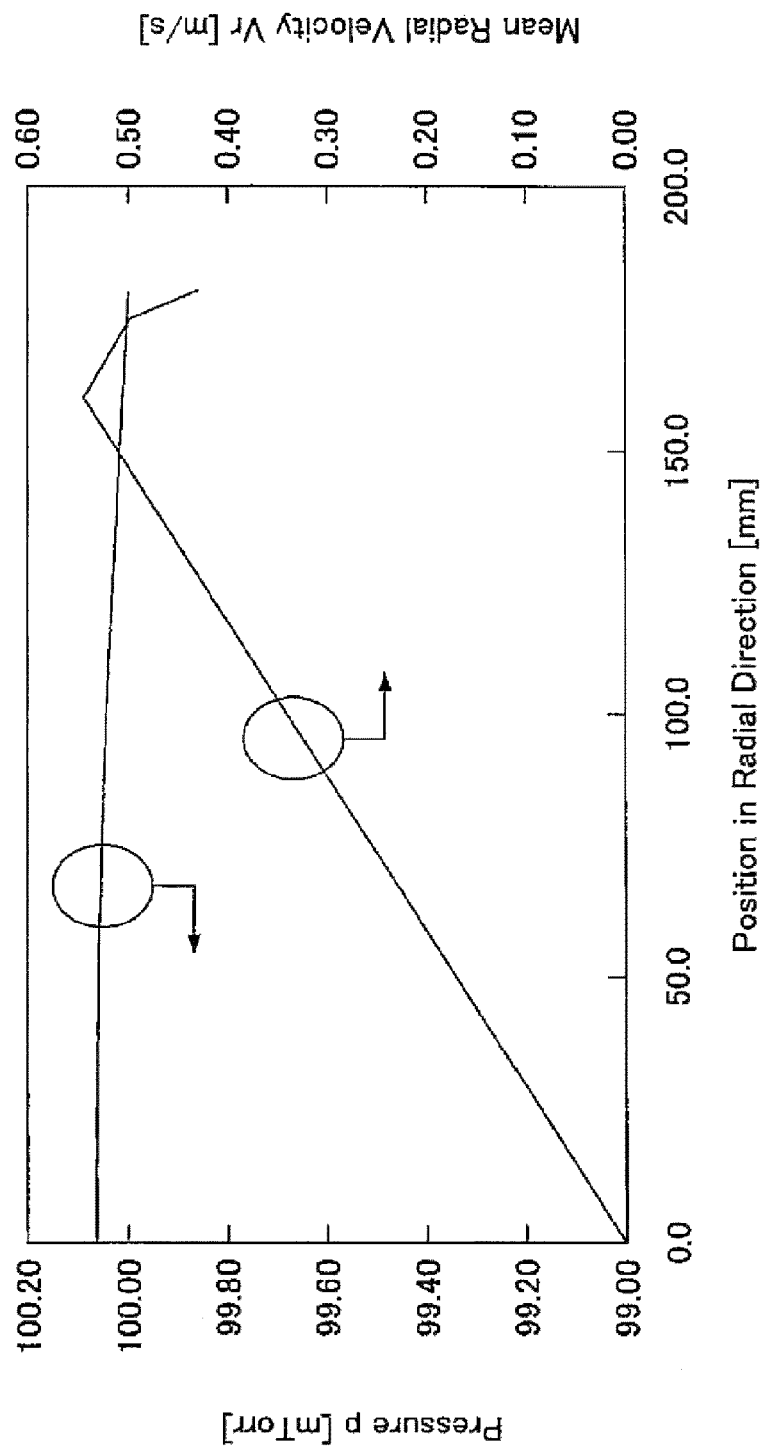
FIG. 5 is a graph illustrating the pressure distribution and the moving fluid speed distribution of the process gas in the surface that occurs during the film formation of FIG. 4.
Figure 6:
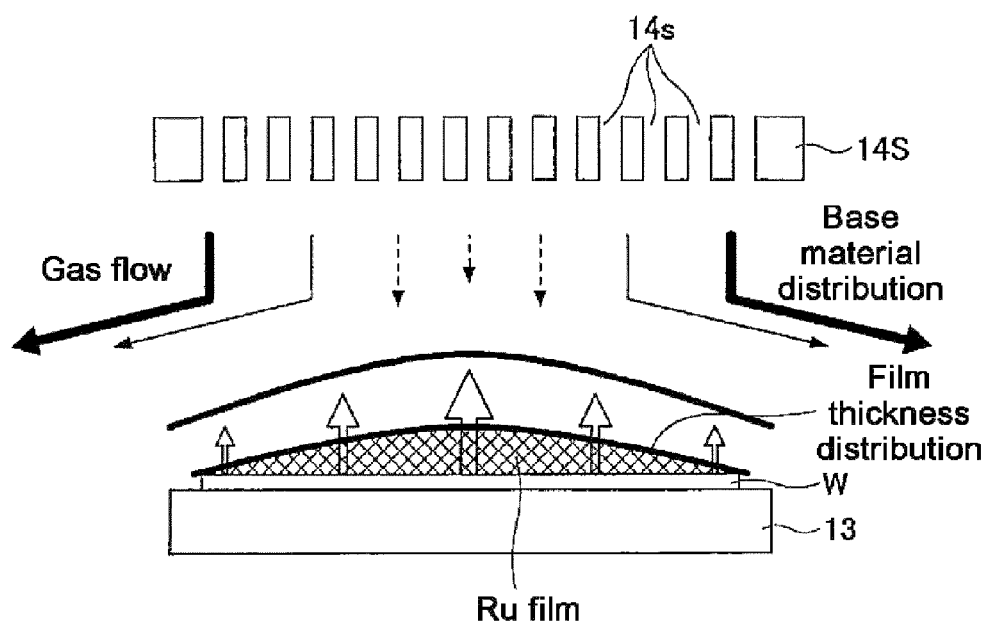
FIG. 6 illustrates base material distribution and film thickness distribution in the surface generated during the film formation of FIG. 4.

Referring to FIG. 4, when the gas is discharged from shower head 14S to stage 13, that is, when the gas is discharged from gas discharge holes 14s equally formed at the side of shower head 14S that faces the substrate to be processed W disposed on substrate holding plate 13, the discharged gas flows along the surface of the substrate to be processed to the exhaustion system of the outer periphery with a high speed. At that time, as indicated with the dotted line in the figure, the gas pressure is slightly higher near the center of the shower head to which the gas is provided from line 14B as shown in FIG. 5. Also, the moving fluid speed of the process gas toward the outer periphery direction is slow at the center of the substrate to be processed. As a result, as shown in FIG. 6, the concentration of the base material becomes higher near the center portion of the substrate to be processed W, and corresponding to this, the film thickness is increased at the center portion of the substrate to be processed W thereby generating the film thickness distribution as shown in FIG. 2.

Meanwhile, a gas flow is formed on the surface of the substrate to be processed W along the diameter direction to the outer periphery and the moving fluid speed is increased toward the outer periphery of the substrate to be processed W, which can be known from FIG. 4 and FIG. 5. In the simulation of FIG. 4 or FIG. 6, a wafer having a diameter of 300 mm is used as a substrate to be processed, and shower head 14S with a diameter of 370 mm has discharge holes 14s with a diameter of 6.5 mm spaced equally with 13.8 mm intervals. Also, the distance between shower head 14S and the substrate to be processed W is set to be 18 mm, and the gas is supplied to the shower head with the flow rate of 100 sccm.

Figure 7:
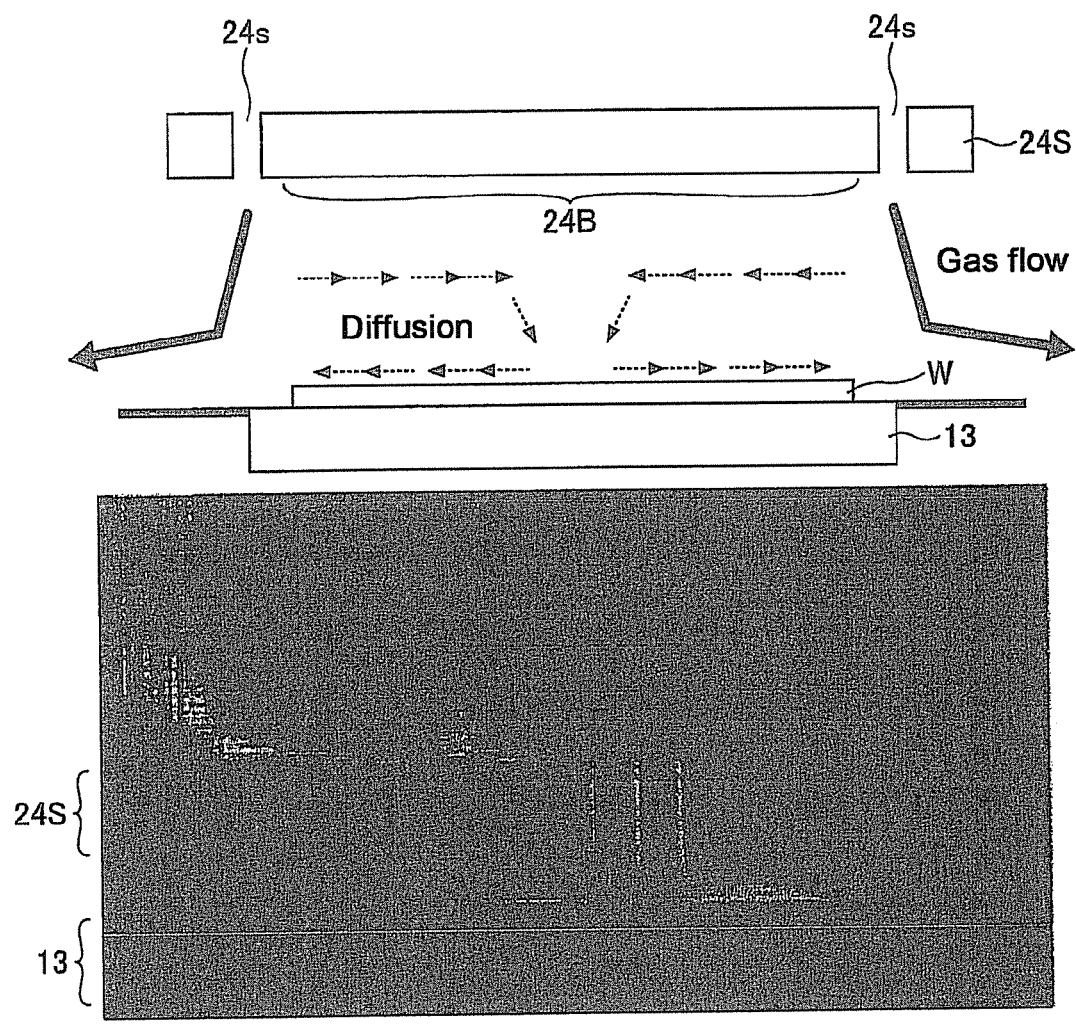
FIG. 7 illustrates the outline of the film formation of the Ru film according to the present invention.

Based on the above knowledge, the inventors of the present invention conceived the formation of the Ru film on the substrate to be processed W as shown in FIG. 7, in which process gas supply member 24S, instead of shower head 14S, having a gas discharge opening 24s as a gas introduction unit at the outer side than the outer periphery of the substrate to be processed W, is used to supply the gas to the outer side than the outer periphery of the substrate to be processed W. Also, a constitution is used that exhausts from an exhaust system (not shown) formed at the outer side than the outer periphery of the substrate to be processed W to form the Ru film on the substrate to be processed W by the chemical species of the process gas diffused from the outer periphery portion to the surface of the substrate to be processed W.

In the constitution of FIG. 7, the direct supply of the gas to the surface of the substrate to be processed W is blocked by baffle portion 24B formed at the inner side than opening 24s of process gas supply member 24S, and the chemical species diffused from the gas flowing the outer periphery of the substrate to be processed W reaches the surface of the substrate W.

Figure 8:
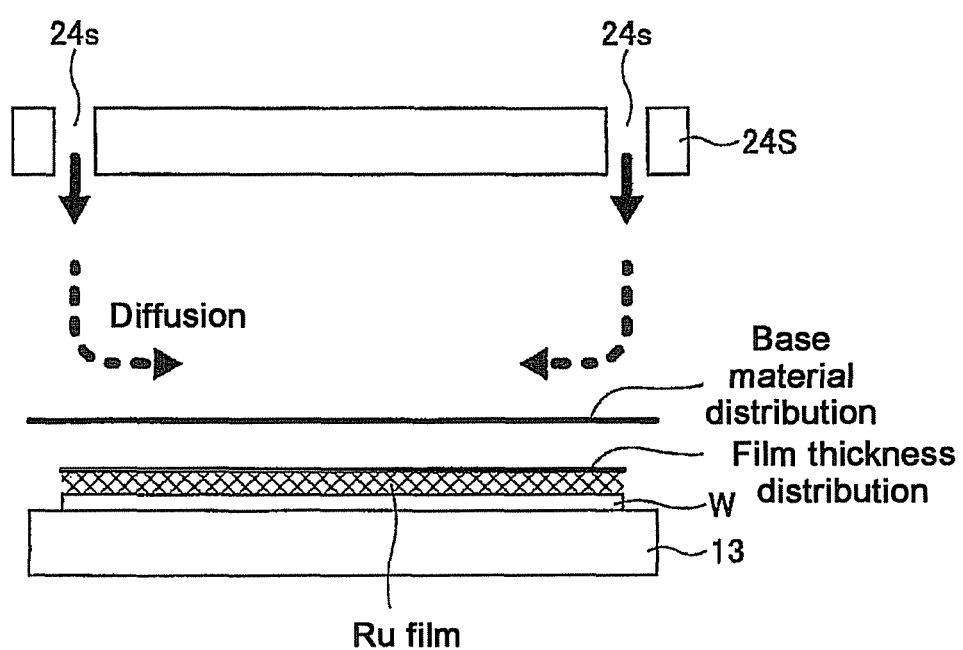
FIG. 8 illustrates the outline of the film formation of the Ru film according to the present invention.

As a result, as roughly illustrated in FIG. 8, it appears that a uniform base material concentration is formed on the surface of the substrate to be processed W and the Ru film is formed on the substrate to be processed W with the same thickness.

Figure 9:
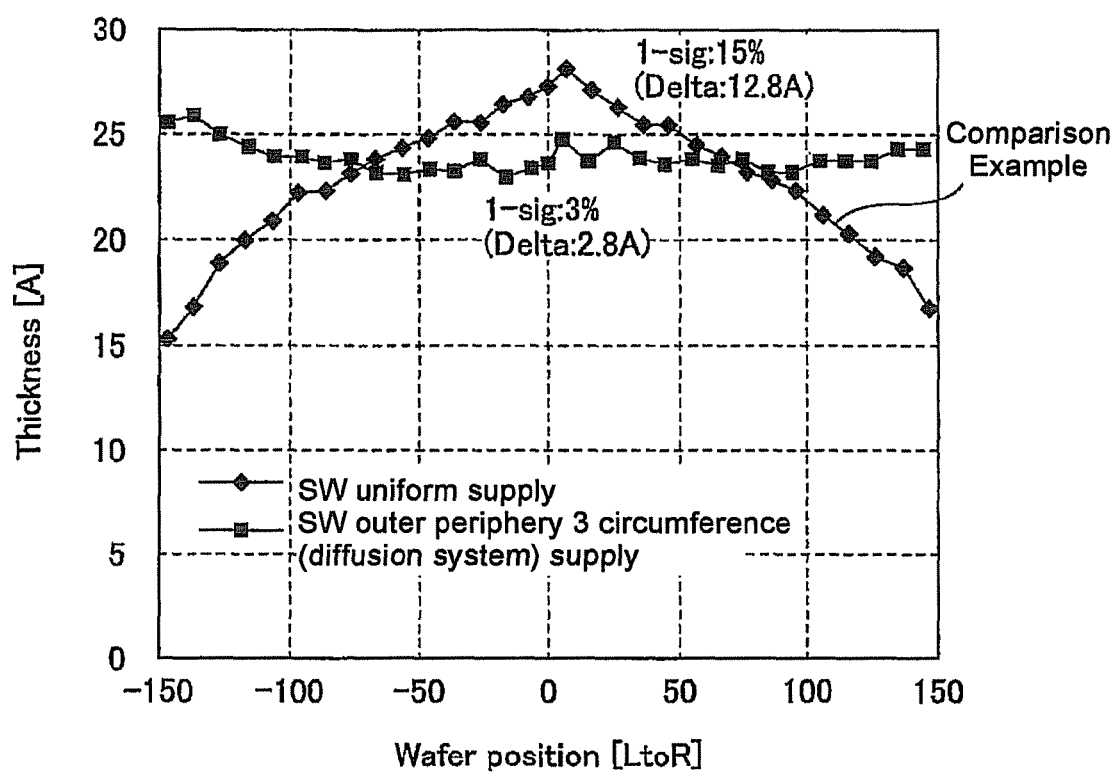
FIG. 9 illustrates the outline of the film formation of the Ru film according to the present invention.
Figure 10:
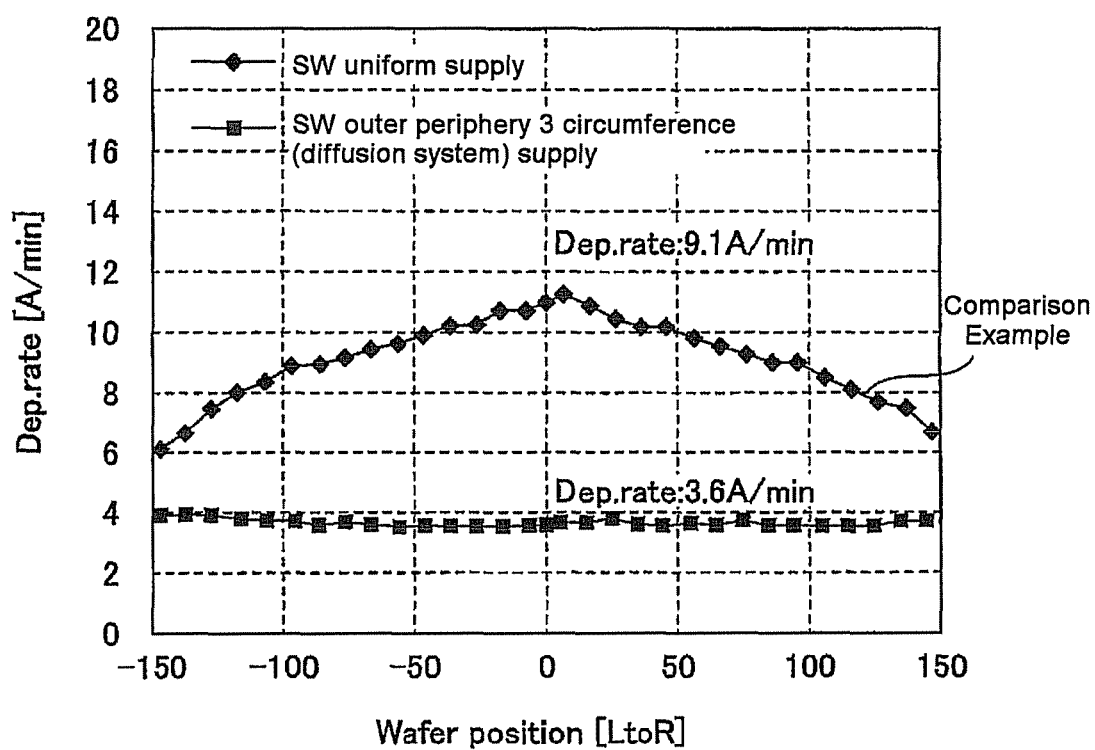
FIG. 10 illustrates the outline of the film formation of the Ru film according to the present invention.

Each of FIG. 9 and FIG. 10 shows the thickness distribution and deposition rate distribution, respectively, of the Ru film in the surface of the substrate when the Ru film is formed with the same film forming apparatus as used in the experiment of FIG. 2 and FIG. 3 but with the discharge holes of shower head 14S are blocked except for the holes at the most outer 3 rows. It is noted that the results from FIG. 2 and FIG. 3 are overlapped with the results of FIG. 9 and FIG. 10.

Referring to FIG. 9, by supplying the process gas to the outer side than the outer periphery of the substrate to be processed W to perform the film formation, it is confirmed that the standard deviation ($\sigma$) of the film thickness variation of the Ru film formed on the substrate to be processed W decreased to about 15% to 3% as compared to the case where shower head 14S having equally formed discharge holes is used, and the maximum thickness difference ($\Delta$) of the surface is decreased from 12.8 Å to 2.8 Å. Likewise, as is clear from FIG. 10, the deposition rate in the surface is greatly improved as compared to the case where shower head 14S is used.

First Embodiment

FIG. 11a illustrates the constitution of film forming apparatus 40 according to the first embodiment of the present invention. Referring to FIG. 11a, film forming apparatus 40 includes an outside chamber 41 exhausted by an exhaust system (not shown), and an inside process chamber 42 formed at the inside of outside chamber 41 and is provided with an exhaust path 42A at the outer periphery. Inside process chamber 42 is exhausted via outside chamber 41. Substrate holding plate 43 is provided at the bottom portion of inner process chamber 42 to support the substrate to be processed W and carries a cover ring 43A coupled at the periphery portion. Cover ring 43A is coupled with the lower end portion of the outside wall of inner process chamber 42, and inner process chamber 42 defines a closed process space 42S.

Figure 11B:
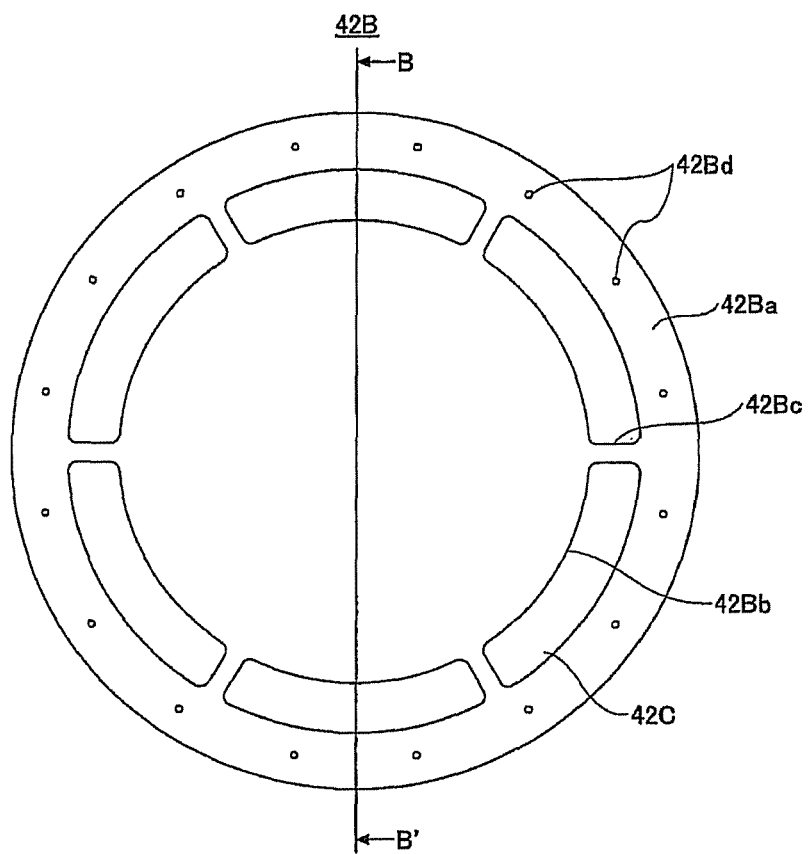
FIG. 11b is a schematic diagram of a film forming apparatus according to a first embodiment of the present invention.
Figure 11C:
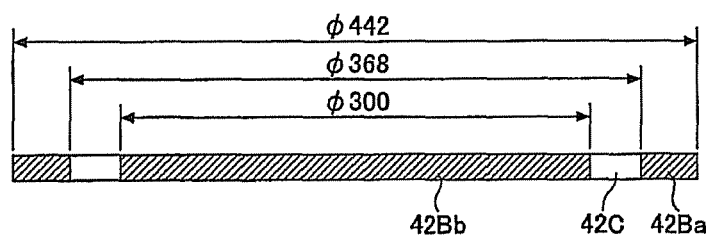
FIG. 11c is a schematic diagram of a film forming apparatus according to a first embodiment of the present invention.

Although, process space 42S is provided with the process gas from process gas supply line 42D, a baffle plate 42B is provided in process space 42S between opening 42d at inner process chamber 42 of process gas supply line 42D and the substrate to be processed W on substrate holding plate 43, as illustrated in FIG. 11b and FIG. 11c. The supplied process gas flows to exhaust path 42A through opening 42C formed at the periphery of baffle plate 42B. Here, FIG. 11b illustrates the plan view of baffle plate 42B, and FIG. 11c is a cross-sectional view along the line B-B' of FIG. 11b.

Referring to FIG. 11b and FIG. 11c, baffle plate 42B is formed with a flange portion 42Ba which forms a portion of inner process chamber 42 and a baffle portion 42Bb supported by a rib 42Bc. And for baffle portion 42Bb, flange portion 42Ba is supported at inner process chamber 42. Flange portion 42Ba is provided with screw holes 42Bd to fix into inner process chamber 42.

Substrate holding plate 43 includes a baffle plate 43B which is different from baffle plate 42B. The process gas exhausted from opening 42C through exhaust path 42A flows into the exhaustion system identical to exhaust system 11 of FIG. 1 through opening 43b inside baffle plate 43B.

As a result, the desired Ru film is formed by the dissociation from the reaction of the $Ru_3(CO)_{12}$ molecules described above and diffused from the flow of the process gas that passes opening 42C.

Meanwhile, when process gas supply member 24S of FIG. 7 is used instead of shower head 14S in film forming apparatus 10 of FIG. 1, while the distribution of the thickness and the deposition rate of the formed Ru film in the surface are improved as explained in FIG. 9 and FIG. 10, the deposition rate is decreased drastically as shown in FIG. 10.

Therefore, in order to improve the deposition rate without degrading the distribution of the Ru film thickness and the deposition rate in the surface, an experiment has been performed in which the diameter D of baffle plate 42, the distance between baffle plate 42B and the substrate to be processed W, the width C of exhaust path 42A and the width A of opening 43b formed at baffle plate 43B are varied to form the Ru film. Exhaust path 42A and opening 43b are working as an iris or an aperture inserted into the exhaust system of film forming apparatus 40. In the experiment, the $Ru_3(CO)_{12}$ raw gas is supplied from process gas supply line 42D with a flow rate of 1 sccm~2 sccm along with 100 sccm of CO carrier gas, and the Ru film is formed at 190° C. of substrate temperature.

Figure 12A:
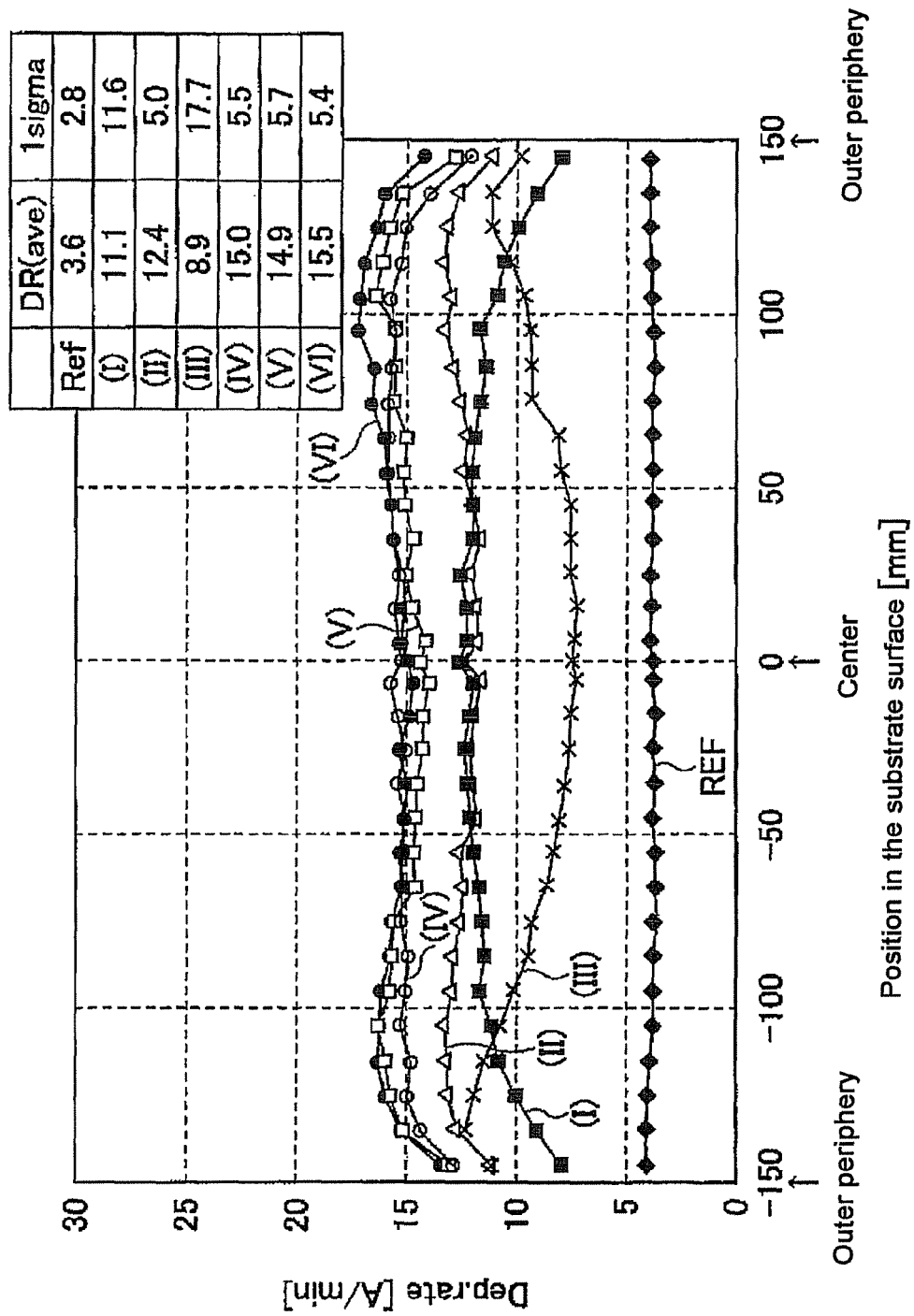
FIG. 12a is a graph illustrating the uniformity of the deposition rate in the surface during the film forming of the Ru film according to the first embodiment.

FIG. 12a illustrates the experimental results where the horizontal line represents the deposition rate and the vertical line represents the position in the surface of the substrate to be processed W. In FIG. 12a, the position in the surface of the substrate indicates a position along the A-A' line of a silicon wafer having a diameter of 300 mm used as a substrate to be processed W.

Referring to FIG. 12a, "Ref" indicates the experiment of FIG. 10, and "I" represents a case where a disk type member having a diameter of 200 mm is used as baffle plate 42B, the distance G is set to be 67 mm, the width C of exhaust path 42A is set to be 19.5 mm, and the width A of opening 43b is set to be 77 mm. "II" represents a case where a disk type member having a diameter of 300 mm is used as baffle plate 42B, the distance G is set to be 67 mm, the width C of exhaust path 42A is set to be 19.5 mm, and the width A of opening 43b is set to be 77 mm. "III" represents a case where a disk type member having a diameter of 300 mm is used as baffle plate 42B, the distance G is set to be 25 mm, the width C of exhaust path 42A is set to be 19.5 mm, and the width A of opening 43b is set to be 77 mm. "IV" represents a case where a disk type member having a diameter of 300 mm is used as baffle plate 42B, the distance G is set to be 67 mm, the width C of exhaust path 42A is set to be 2 mm, and the width A of opening 43b is set to be 77 mm. "VI" represents a case where a disk type member having a diameter of 300 mm is used as baffle plate 42B, the distance G is set to be 67 mm, the width C of exhaust path 42A is set to be 19.5 mm, and the width A of opening 43b is set to be 2 mm.

While the average deposition rate is 3.6 Å/min and the standard deviation ($\sigma$) of the variation in the surface is 2.8% in the "Ref" experiment, the average deposition rate is 11.1 Å/min and the standard deviation ($\sigma$) of the variation in the surface is 11.6% in the experiment "I". In the experiment "II", the average deposition rate is 12.4 Å/min and the standard deviation ($\sigma$) of the variation in the surface is 5.0%. In the experiment "III", the average deposition rate is 8.9 Å/min and the standard deviation ($\sigma$) of the variation in the surface is 17.7%. In the experiment "IV", the average deposition rate is 15.0 Å/min and the standard deviation ($\sigma$) of the variation in the surface is 5.5%. In the experiment "V", the average deposition rate is 14.9 Å/min and the standard deviation ($\sigma$) of the variation in the surface is 5.7%. In the experiment "VI", the average deposition rate is 15.5 Å/min and the standard deviation ($\sigma$) of the variation in the surface is 5.4%.

Referring to FIG. 12a, as illustrated in FIG. 11a, it can be known that the deposition rate is improved by making the conductance of the exhaustion path from processing chamber 42 at exhaust path 42A and opening 43b small. Moreover, it can be also known that the distribution of the deposition rate in the surface is improved when the diameter D of baffle plate 42B is 300 mm which is the same as the diameter of the substrate, rather than 200 mm.

Figure 12B:
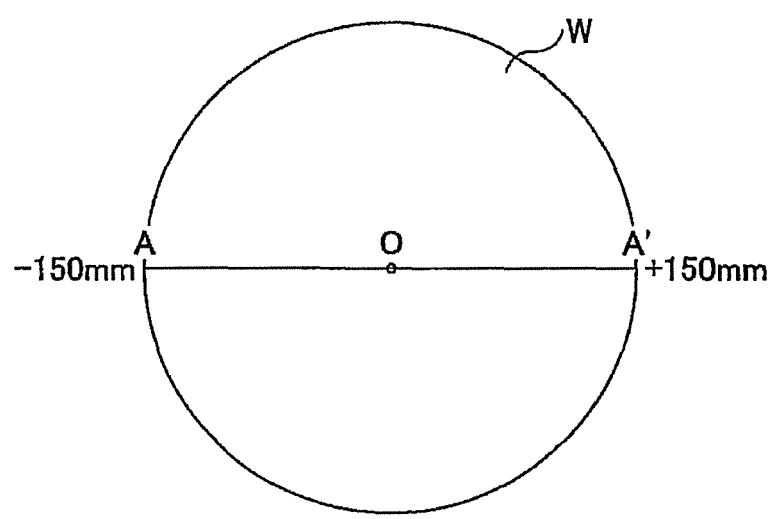

As described above, it is confirmed that the uniformity of the film formation on the substrate to be processed strongly depends on the diameter D of baffle plate 42B, and the inventors of the present invention investigated the uniformity of the Ru film thickness in the surface obtained when the diameter D of baffle plate 42B is further increased to 340 mm in film forming apparatus 40 of FIG. 11a or FIG. 11c. The results are shown in FIG. 13 where the horizontal line represents the position in the surface along the line A-A' of FIG. 12b, and the vertical line represents the standardized thickness of the Ru film at the center portion (substrate inside position=0 mm) of the substrate to be processed W, as in FIG. 12a.

Figure 13:
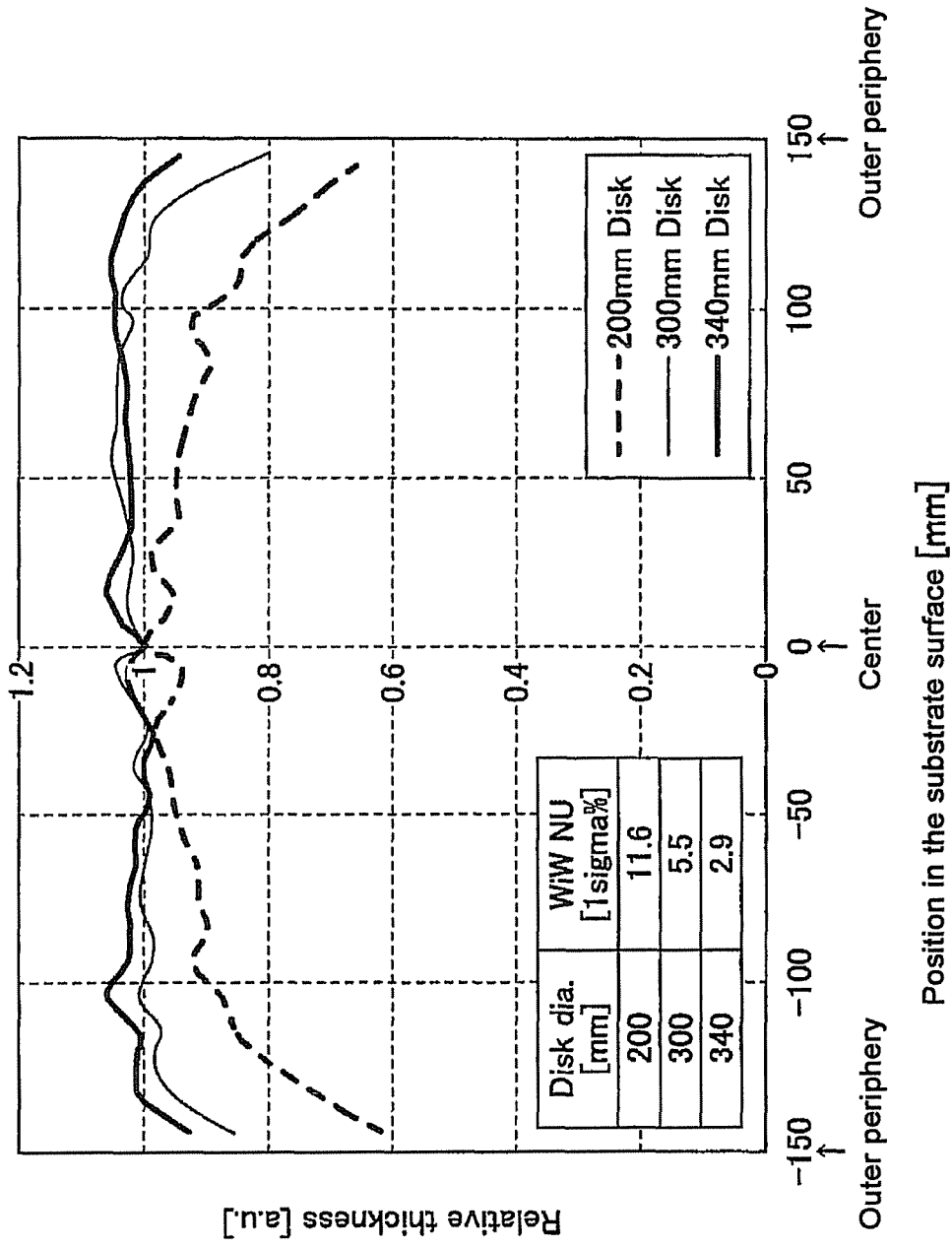
FIG. 13 is a graph illustrating the size effect of a baffle plate in the film forming apparatus of FIG. 11a through FIG. 11c.

Referring to FIG. 13, the uniformity inside the surface is superior when the diameter D of baffle plate 42B is 300 mm (the standard deviation of the variation of the film thickness is 5.9%) as compared to when the diameter D of baffle plate 42B is 200 mm (the standard deviation of the variation of the film thickness is 11.6%). Specifically, when the diameter D is changed from 200 mm to 300 mm, the degree of the improvement of the uniformity in the surface is extremely large such that the standard deviation of the film thickness variation in the surface ranges from 11.6% to 5.9%. Accordingly, it can be decided that the improvement of the uniformity of the formation of the Ru film on the substrate to be processed W is more effective when the diameter of the baffle plate 42B is larger than that of the substrate to be processed W.

However, as described above, in the present invention, the dissociation is suppressed during the transport of the base material by using the CO as a carrier gas during the formation of the metal film by the CVD method using the metal carbonyl base material such as Ru. Also, as in the present embodiment, in a substrate processing apparatus having an apparatus where the metal carbonyl is diffused into the center portion of the substrate to be processed W and the dissociation during the diffusion is suppressed and transported by using the carbon monoxide atmosphere, it is important to maintain the suppression effect of the dissociation of the metal carbonyl during the diffusion by the CO to perform a film formation that has an excellent characteristic of, for example, the step coverage.

Figure 14:
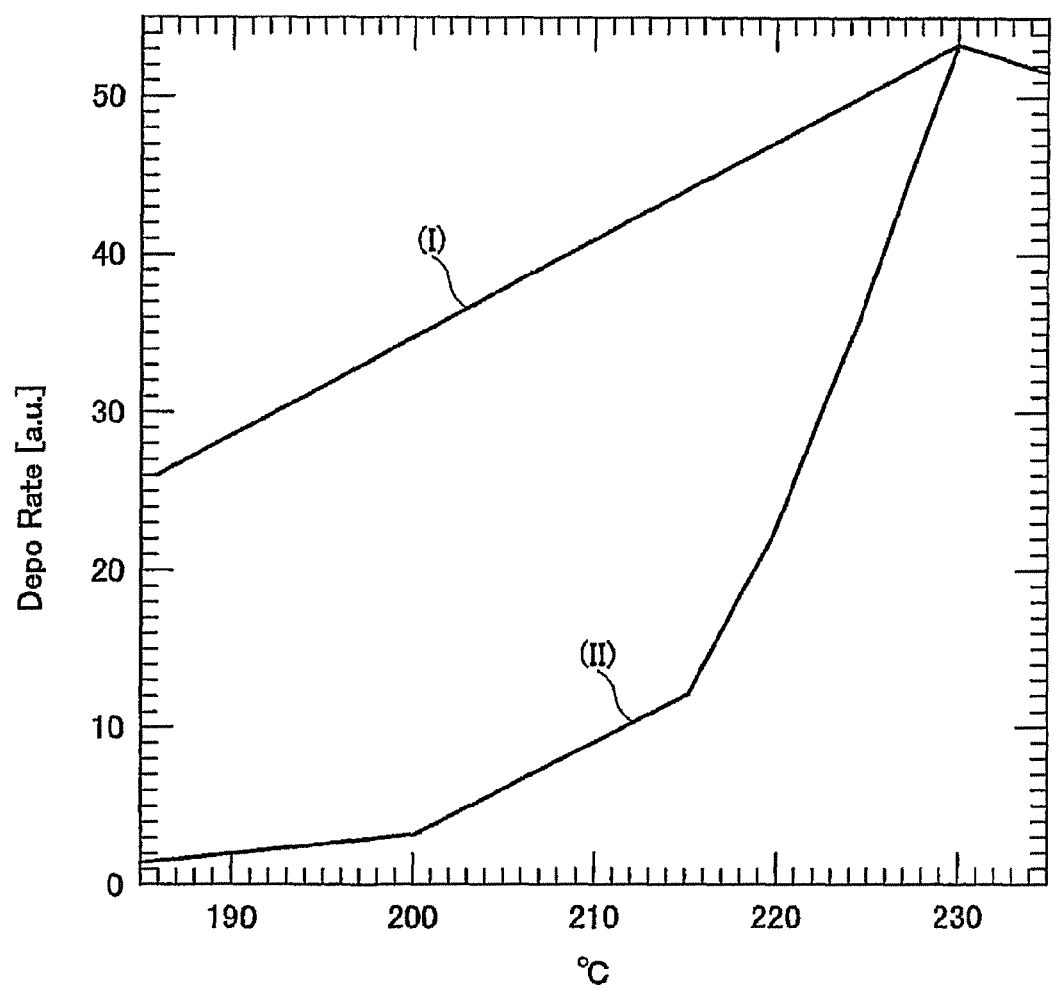
FIG. 14 is a graph illustrating the temperature dependence of the dissociation suppression effect of the Ru carbonyl base material in the carbon monoxide atmosphere.

FIG. 14 is a graph that illustrates the effect of the substrate temperature with respect to the dissociation suppression effect by the addition of the CO gas to the base material of $Ru_3(CO)_{12}$. In FIG. 14, the vertical line represents the deposition rate of the Ru film, and the horizontal line represents the substrate temperature. Also, the line I indicates the formation of the Ru film where the CO is not added to the $Ru_3(CO)_{12}$, and the line II indicates the formation of the Ru film from the base material of $Ru_3(CO)_{12}$ under the CO atmosphere.

Referring to FIG. 14, it is confirmed that when the substrate temperature is below 200° C., the deposition rate of $Ru_3(CO)_{12}$ film under the CO atmosphere is very low and the dissociation is practically suppressed. However, it is also confirmed that when the substrate temperature exceeds 200° C., the suppression effect is gradually decreased, and the effectiveness is almost lost when exceeding 230° C. Accordingly, when the temperature of the substrate to be processed W is set to be 235° C. or higher in film forming apparatus 40 of FIG. 11a or FIG. 11c, the film is preferentially formed at the periphery of the substrate and the uniformity of the desired film formation in the surface is damaged.

In view of this, when a metal film is formed in film forming apparatus 40 of FIG. 11 using the metal carbonyl base material, for example, when the Ru film is formed using $Ru_3(CO)_{12}$ base material, it is preferable that the substrate temperature is set to be 230° C. or lower where the dissociation suppression effect of the metal carbonyl by the CO is effectively act. Also, it is more preferable to set the substrate temperature to be 200° C. or lower because the dissociation suppression effect acts sufficiently at the temperature range. Moreover, since the dissociation of $Ru_3(CO)_{12}$ base material begins at 100° C. or higher when the CO exists, it is preferable to set the substrate temperature to be 100° C. or higher.

Also, the deposition rate of the Ru film on the substrate to be processed W can be improved as well by increasing the temperature of the base material container that constitute a portion of base material supply system 14 as shown in FIG. 1.

Figure 16:
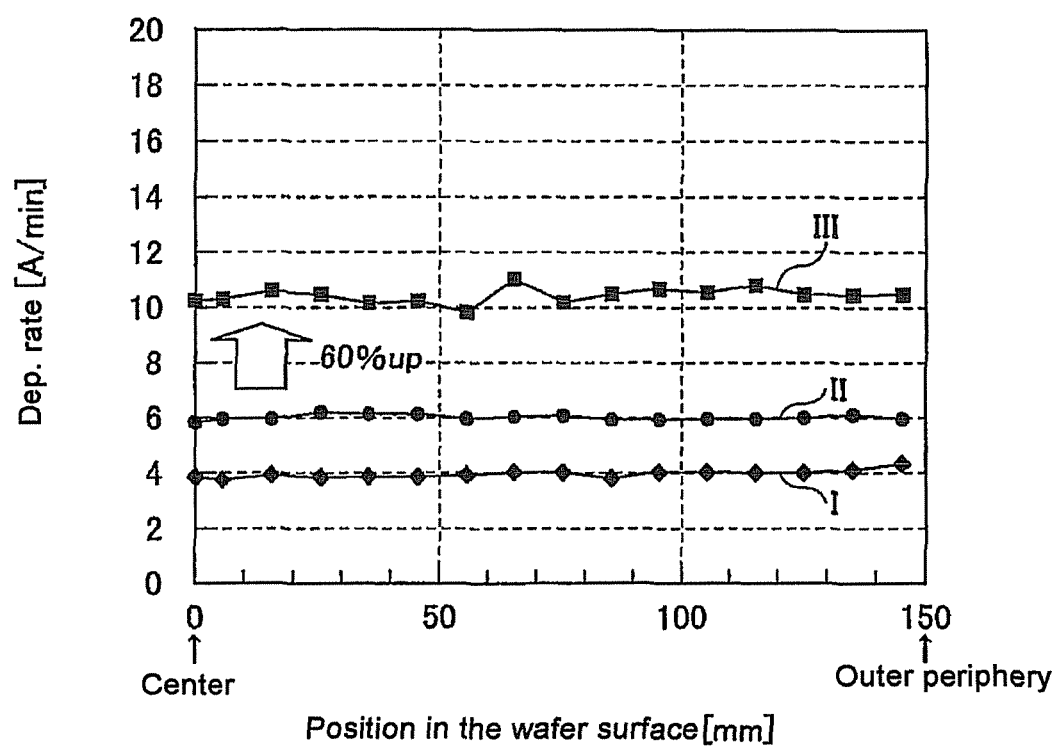
FIG. 16 is a graph illustrating the variation of the Ru film forming speed according to the temperature changes of the base material chamber.

FIG. 16 is a graph that illustrates the variation of the uniformity of the deposition rate in the surface when the temperature of a base material container 14A is changed in the film forming apparatus having the constitution of FIG. 7 that uses process gas supply member 24S instead of shower head 14S in film forming apparatus of FIG. 1.

In FIG. 16, data "I" indicates a case where the temperature of the base material container is set to be 75° C. and corresponds to the result of prior FIG. 10. In contrast, data "II" is a case where a baffle plate identical to baffle plate 43B of FIG. 11a is provided around substrate holding plate 13 in the constitution of FIG. 7. It is confirmed that while other conditions are the same as in data "I", the average deposition rate is increased up to 6 Å/min because the conductance of the exhaust path is reduced. In data "II", the variation of the deposition rate of the formed Ru film in the surface is suppressed as 2% of standard deviation, and an improved uniformity in the substrate surface is achieved.

Also, in FIG. 16, data "III" indicates the distribution of the deposition rate in the surface when the maintaining temperature of base material container 14A is set to be 85° C. in the film forming apparatus where the baffle plate is added to the constitution of FIG. 7 based on the constitution of FIG. 1. As can be known from FIG. 16, the average deposition rate is improved 60% from 6 Å/min to 10 Å/min by increasing the maintaining temperature of base material container 14A from 75° C. to 85° C. and maintaining other conditions to be the same. In data "III" as well, the variation of the deposition rate in the surface is suppressed by 2.6% of standard deviation to obtain an improved uniformity in the substrate surface.

Also, in the constitution of FIG. 7 through FIG. 11, the deposition rate of the Ru film can be improved by maintaining the partial pressure of the CO gas in the process chamber and by increasing the flow rate of the CO carrier gas.

Figure 17:
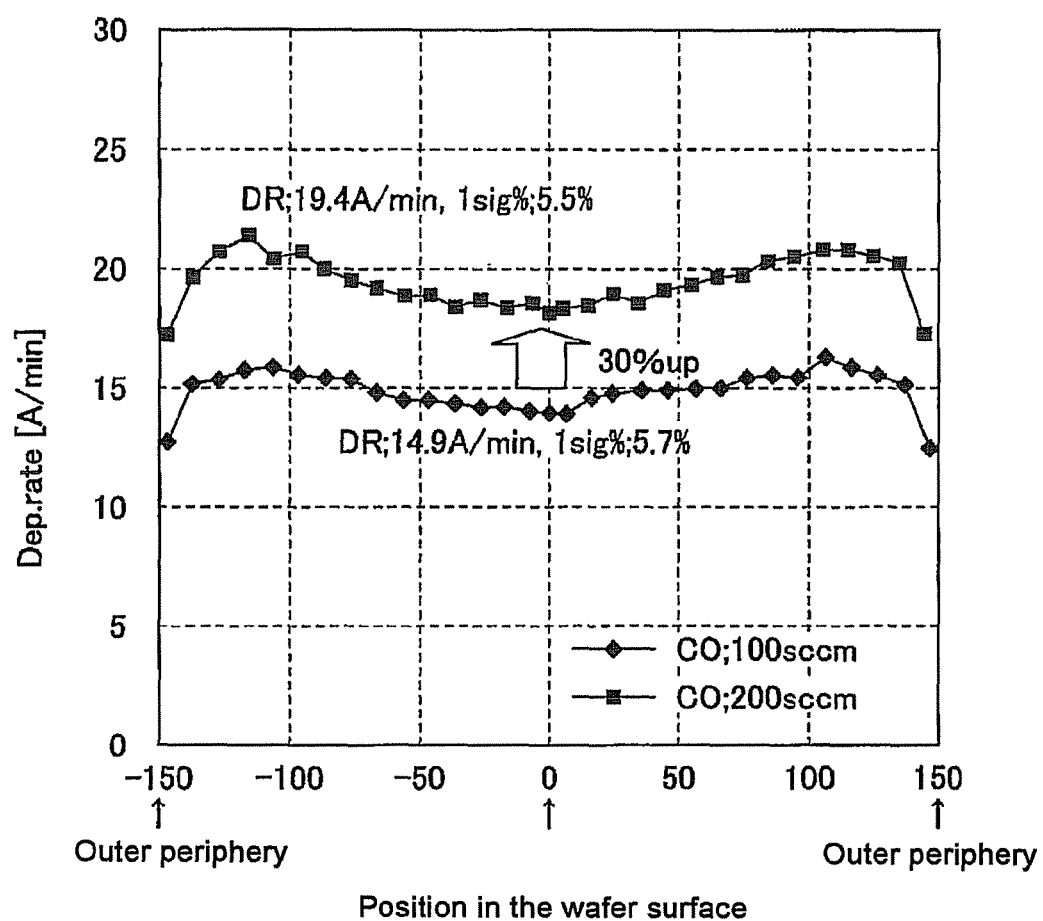
FIG. 17 is a graph illustrating the variation of the Ru film forming speed according to the gas flow rate changes of the CO carrier gas.

FIG. 17 is a graph that illustrates the uniformity of the deposition rate of the Ru film in the surface when only the flow rate of the CO carrier gas is increased from 100 sccm to 200 sccm and other conditions are maintained to be the same, in film forming apparatus 40 of FIG. 11a through FIG. 11c Referring to FIG. 17, it is indicated that the average deposition rate is 14.9 Å/min when the flow rate of CO carrier gas is 100 sccm. However, when the CO carrier gas flow rate increases to 200 sccm, the deposition rate increases about 30% to 19.4 Å/min. Also, the variation of the deposition rate in the surface is maintained in the range of 5.5%~5.7% of standard deviation under any circumstances and an excellent uniformity in the substrate surface is achieved.

Figure 18:
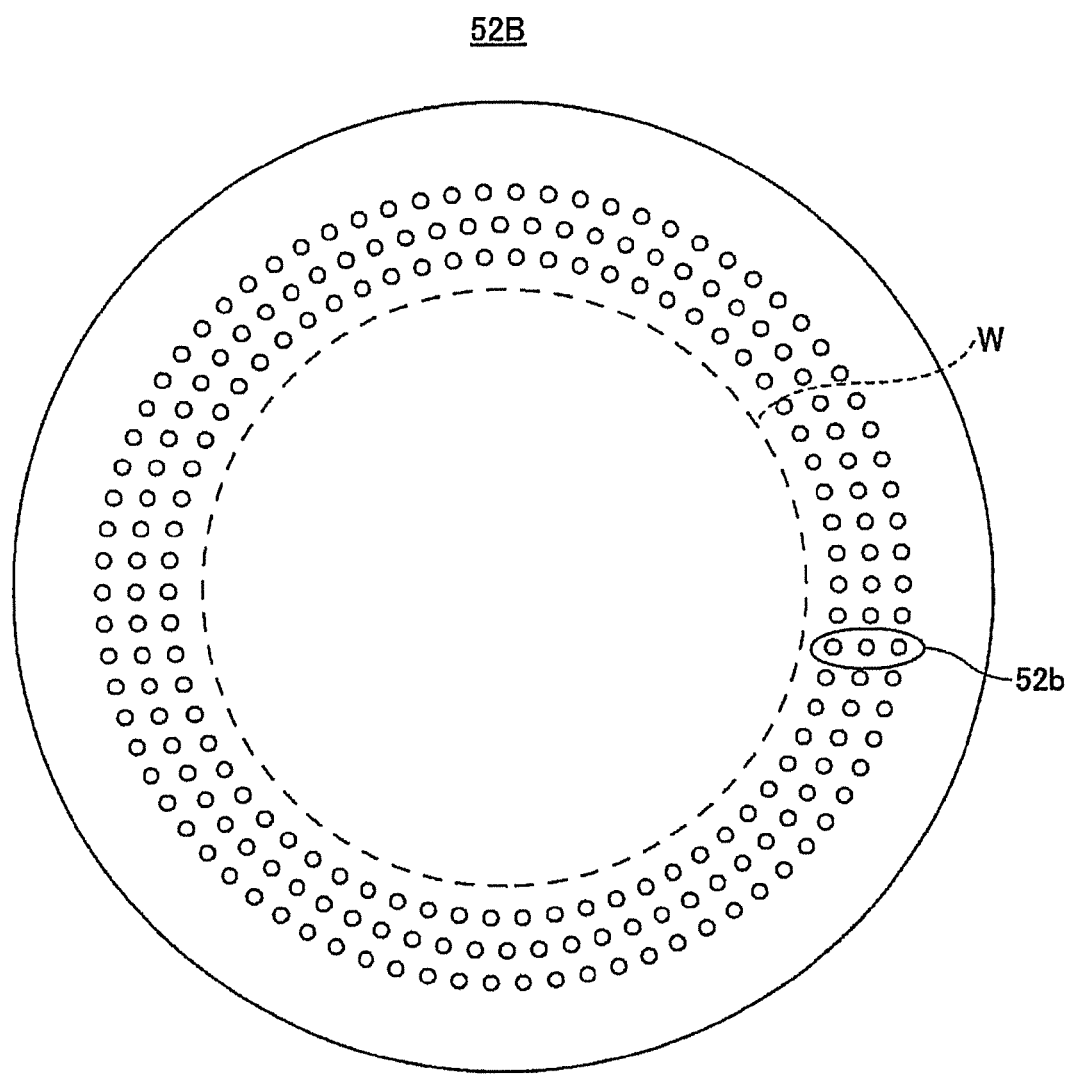
FIG. 18 illustrates a modified example of the first embodiment.
Figure 19:
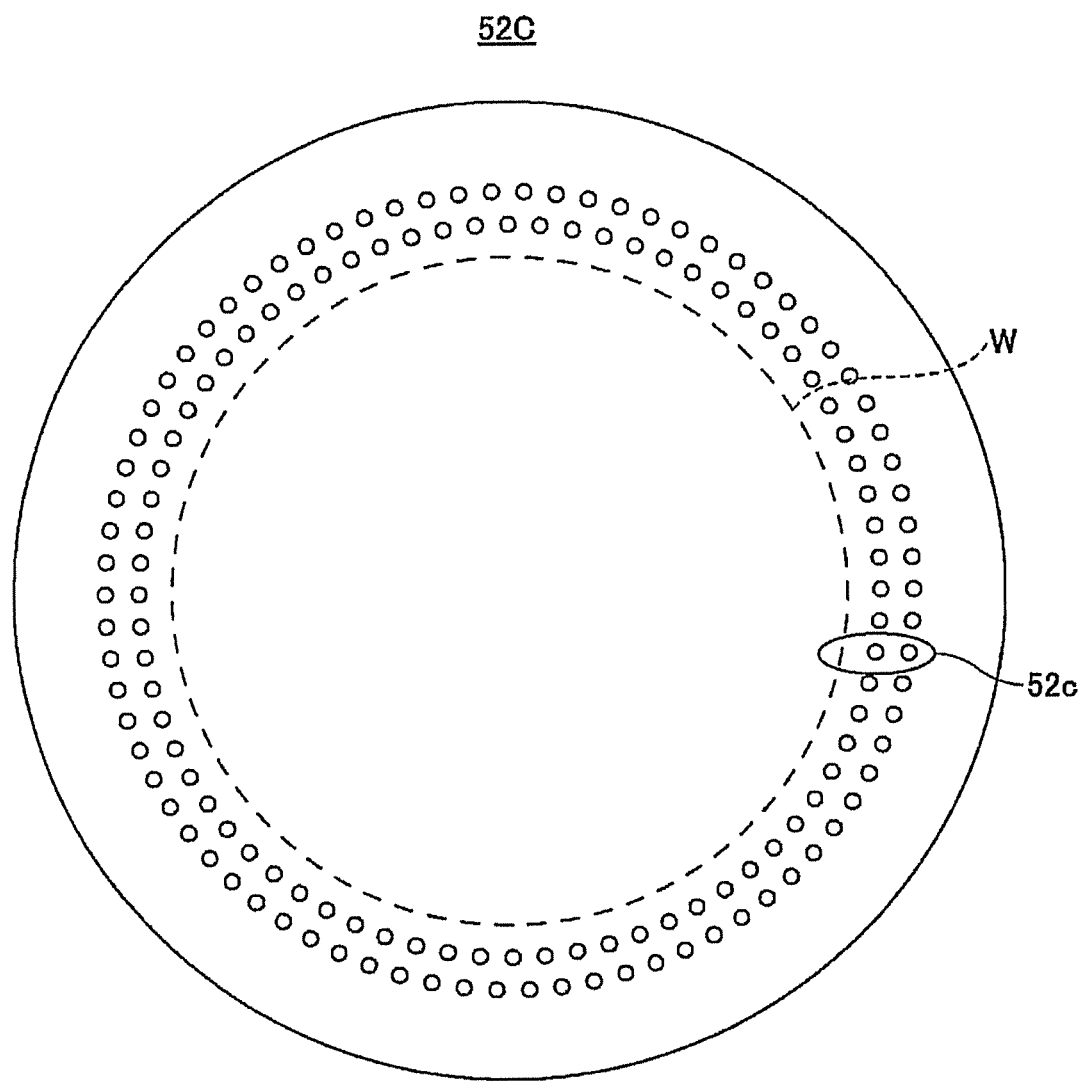
FIG. 19 illustrates another modified example of the first embodiment.

FIG. 18 and FIG. 19 each illustrates the constitution of a baffle plate 52B as a modified embodiment of baffle plate 42B of FIG. 11b.

Referring to FIG. 18 and FIG. 19, when viewed from a vertical direction with respect to substrate holding plate 43, baffle plate 52B is provided with 3 rows of opening 52b or 2 rows of opening 52c positioned along the outer periphery of the substrate to be processed W corresponding to opening 42C of FIG. 11a through FIG. 11c. For example, it is possible to supply the process gas to the outside of outer periphery of the substrate to be processed W as in film forming apparatus 40 of FIG. 11a by setting the diameter of opening 52b or 52c to be 6.5 mm and the distance to be 13.8 mm.

Second Embodiment

Figure 20:
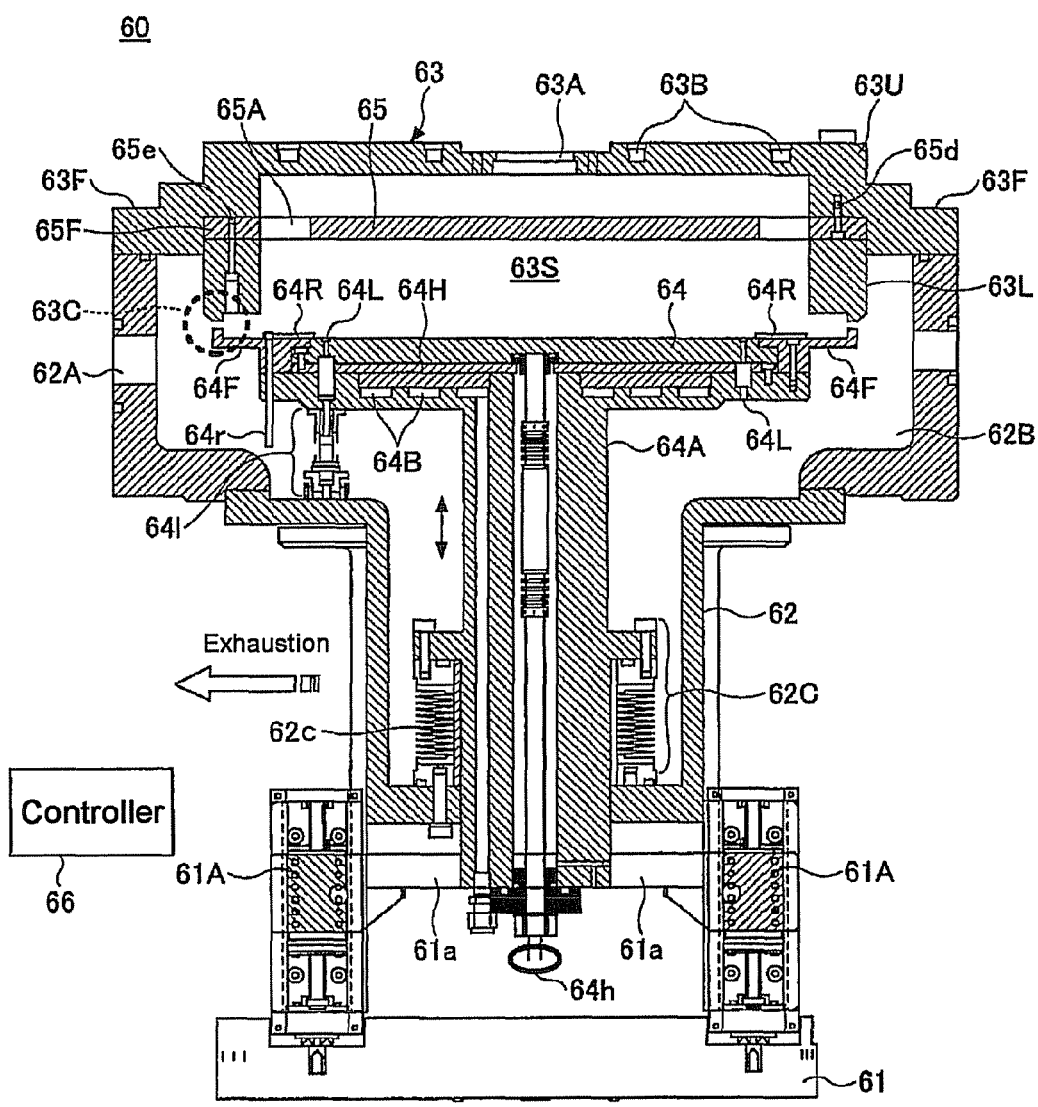
FIG. 20 is a schematic diagram of a film forming apparatus according to a second embodiment.

FIG. 20 illustrates the constitution of film forming apparatus 60 in an idling state, according to the second embodiment. Referring to FIG. 20, film forming apparatus 60 has a structure in which an outer chamber 62 is fixed on a base unit 61 and an inner process chamber 63 formed with a process gas introduce opening 63A is installed to a flange portion 63F. Outer chamber 62 corresponds to outer chamber 41 of FIG. 11a, and a carry in/out space 62A for the substrate is provided at the side wall.

Meanwhile, inner process chamber 63 corresponds to inner process chamber 42 of FIG. 11a and has a cylindrical shape. Also, process gas introduce opening 63A is provided on the upper portion of inner process chamber 63 roughly coinciding with the central shaft. Also, a cool/heat medium path 63B is provided in inner process chamber 63 to control the temperature.

The bottom portion of inner process chamber 63 is opened, and a substrate holding plate 64 corresponding to substrate holding plate 43 of FIG. 11a is provided at the front end of a support unit 64A covering the bottom portion. As a result, inner process chamber 63 along with substrate holding plate 64 defines a process space 63S.

Support unit 64A of substrate holding plate 64 is maintained by an actuator 61A and an arm 61a with respect to base unit 61, and the actuator may be either an electronic type or an oil pressure type. An up/down movement indicated as arrows is performed by driving actuator 61A. Also, the combined portion of support unit 64A and outer chamber 62 is sealed by a seal member 62C that includes bellows 62c.

The bottom portion of outer chamber 62 is provided with an exhaust pipe (not shown), and by connecting exhaust system 11 of FIG. 1, process space 63S is exhausted through the exhaust path formed in between substrate holding plate 64 along with support unit 64A and outer chamber 62.

As shown in FIG. 20, a flange-type baffle portion 64F is provided near substrate holding plate 64, and a continuous exhaust pipe 63C is provided in between baffle portion 64F and the bottom portion of inner process chamber 63. Exhaust path 63C is provided continuously at an outer side than the outer periphery of the substrate to be processed W held on inner process chamber 63. The conductance of exhaust path 63C varies by moving substrate holding plate 64 into up/down direction.

A heater 64H is embedded in substrate holding plate 64 and driven by the driving current from an electrode 64h. Also, a lifter pin 64L is formed on substrate holding plate 64 with the lower end portion 64l including a pin driving unit is fixed to a portion of outer chamber 62. Therefore, when substrate holding plate 64 is descended by actuator 61A, lifter pin 64L is protruded to an upper direction than substrate holding plate 64 thereby lifting the substrate to be processed on substrate holding plate 64. Also, a cool/heat medium path 64B is provided at the lower part of heater 64H inside substrate holding plate 64 to pass the cool/heat medium.

Also, substrate holding plate 64 includes a cover ring 64R which is coupled to the outer periphery of the substrate to be processed held thereon. Cover ring 64R passes through substrate holding plate 64 and extends to the lower direction. Also, cover ring 64R includes a drive unit 64r which is coupled to a portion of outer chamber 62 and clears the combination with the substrate to be processed when substrate holding plate 64 descends.

Also, in film forming apparatus 60 of FIG. 20, a baffle plate 65 corresponding to baffle plate 42B of FIG. 11a is provided inside inner process chamber 63 facing the substrate to be processed on substrate holding plate 64 and with a diameter bigger than that of the substrate to be processed. Also, opening 65A corresponding to opening 42C of FIG. 11a is provided at the outer side than the outer periphery of the substrate to be processed on substrate holding plate 64. Baffle plate 65 includes flange portion 65F at the outside of opening 65A, and flange portion 65F is fixed to the upper half body 63U of inner process chamber 63 by screw 65d. The lower portion of flange portion 65F is fixed to the lower half body 63L of inner process chamber 63 by screw 65e. Upper half body 63U and lower half body 63L along with flange portion 65F form inner process chamber 63.

Also, film forming apparatus 60 of FIG. 20 is equipped with a controller 66 formed with a general purpose computer loaded with a program to control the entire operation including the operation of actuator 61A.

Next, referring to FIG. 21 through FIG. 28, an exemplary process of forming the Ru film on a silicon substrate is described using film forming apparatus 60 of FIG. 20.

Figure 21:
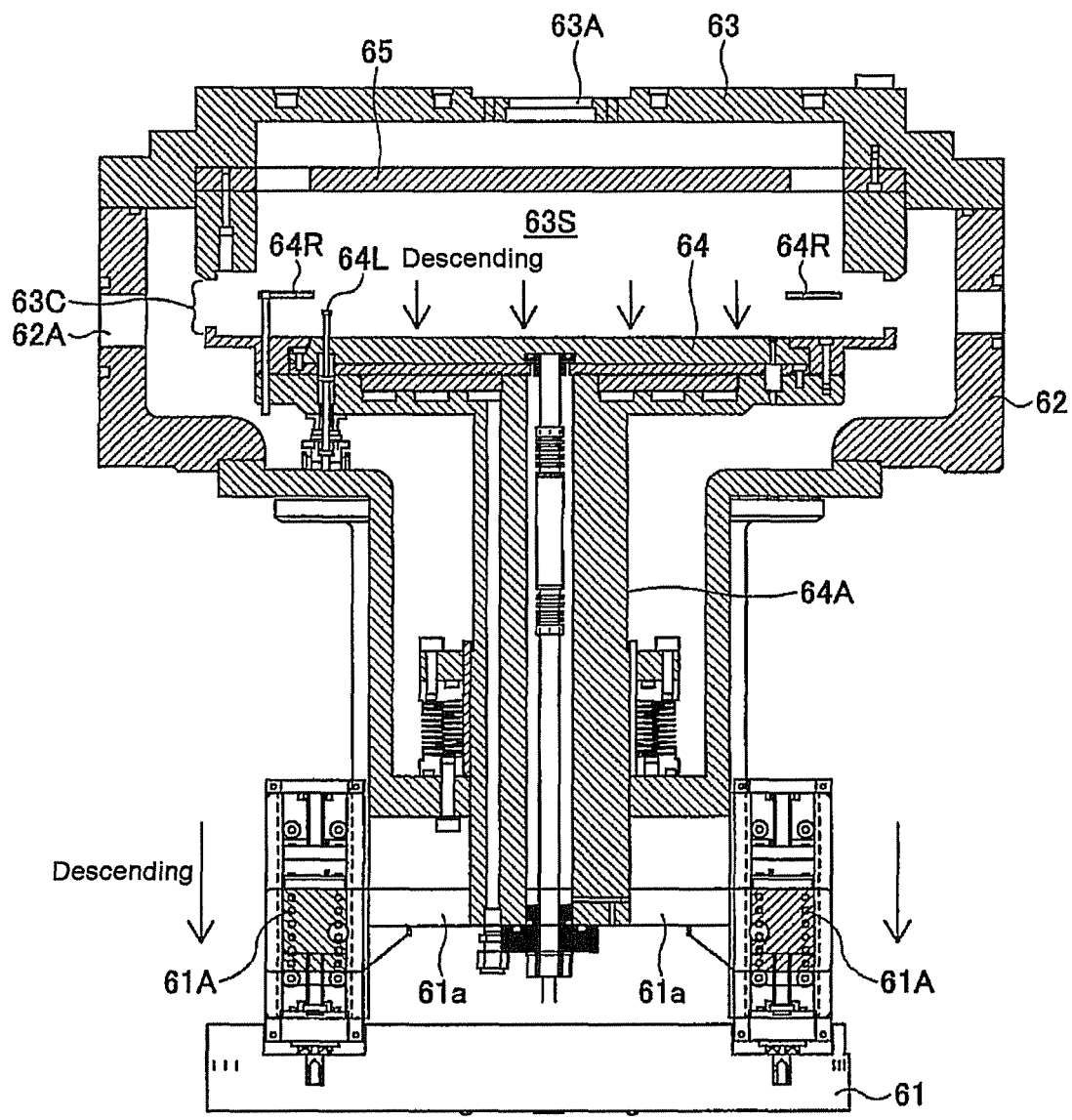
FIG. 21 is a first diagram illustrating a film forming procedure using the film forming apparatus of FIG. 20.

Referring to FIG. 21, actuator 61A is driven toward the lower direction by controller 66, and substrate holding plate 64A is separated from inner process chamber 63 and descends. As a result, exhaust path 63C is widely opened corresponding to substrate carry in/out space 62A of outer chamber 62. In the state of FIG. 21, exhaust path 63C the width of 32.3 mm in an up/down direction. In the state of FIG. 21, as substrate holding plate 64 descends, lifter pin 64L protrudes from the surface of substrate holding plate 64, and cover ring 64R also changes its positional relationship which is separated toward the upper direction than the surface of substrate holding plate 64.

Figure 22:
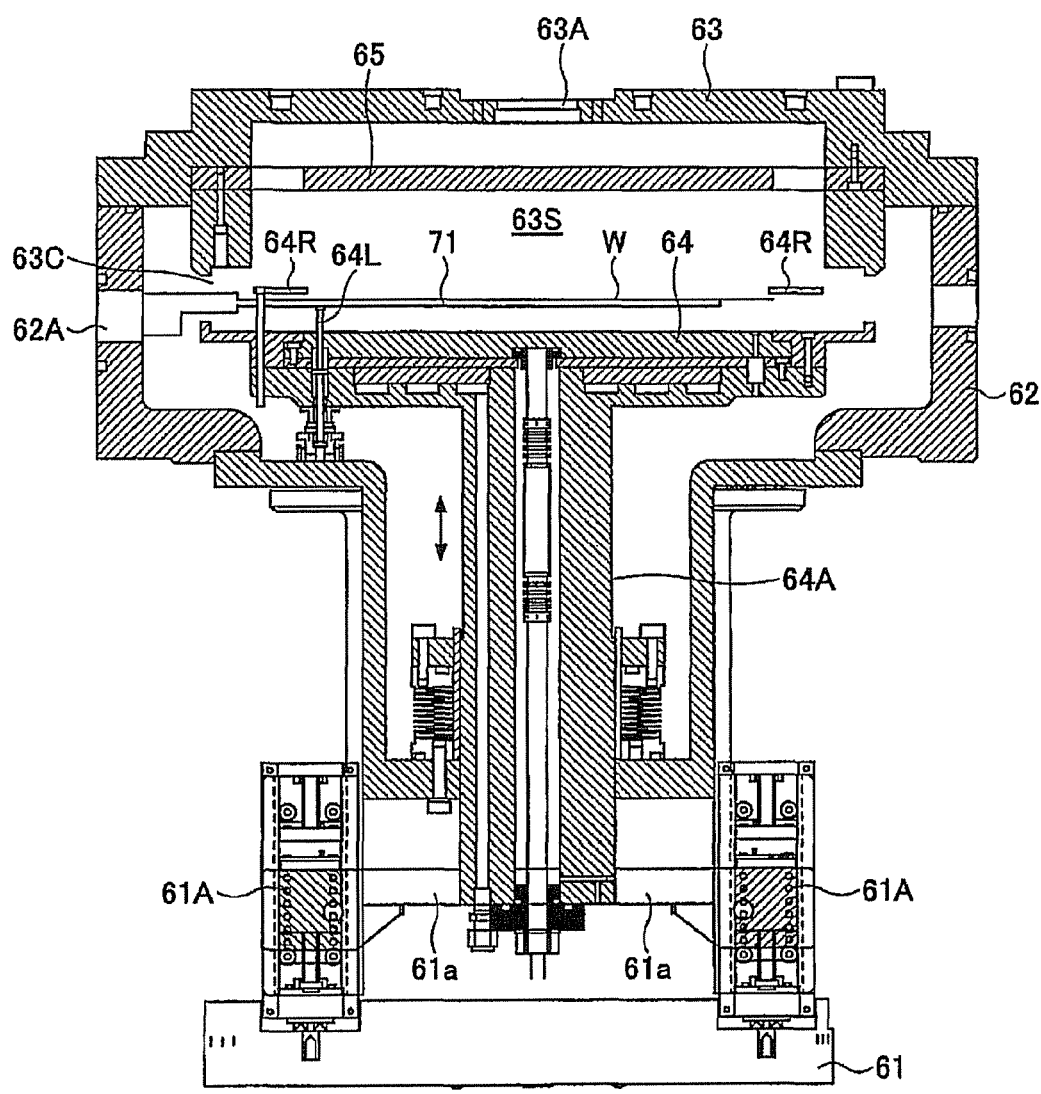
FIG. 22 is a second diagram illustrating a film forming procedure using the film forming apparatus of FIG. 20.
Figure 23:
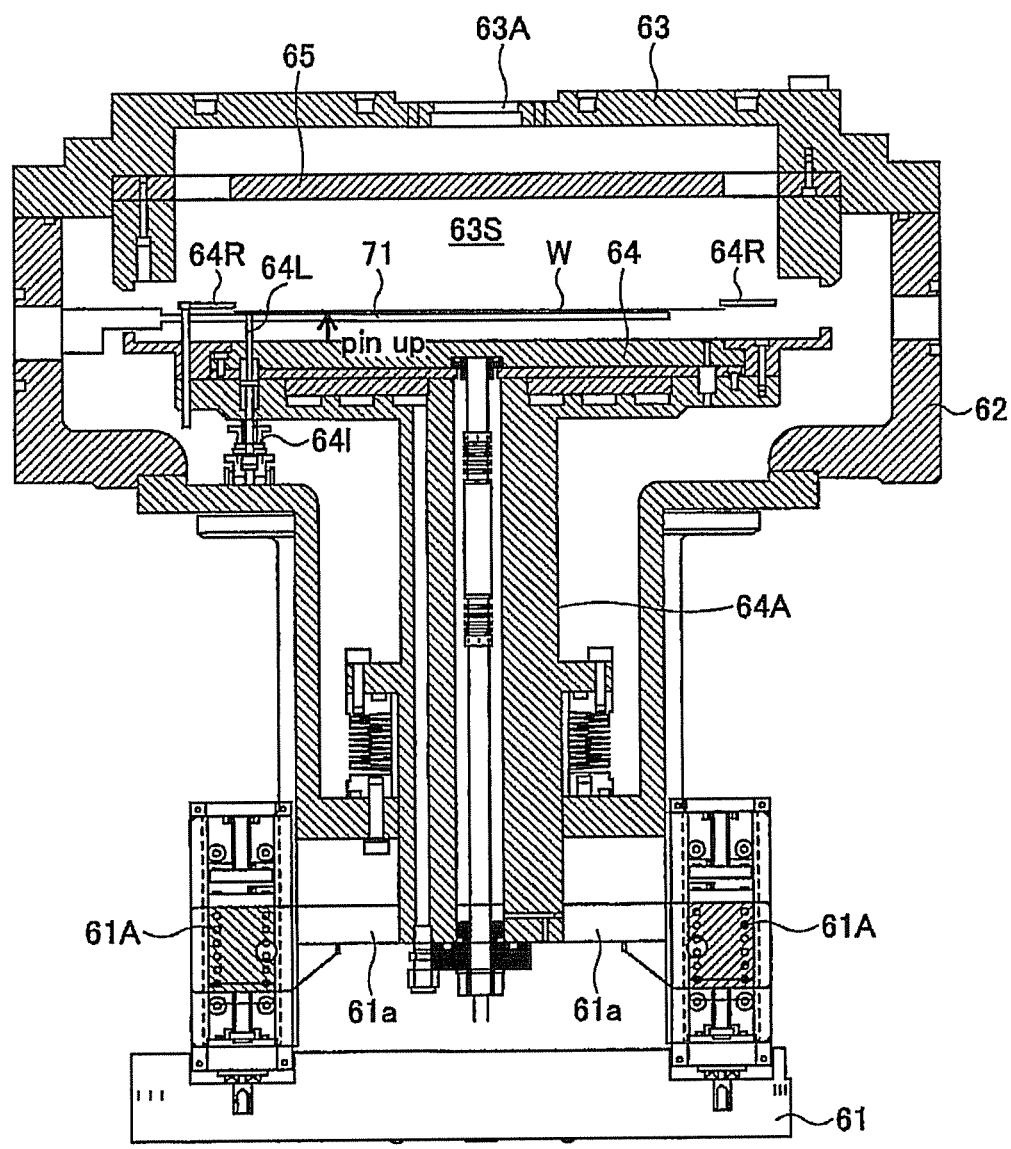
FIG. 23 is a third diagram illustrating a film forming procedure using the film forming apparatus of FIG. 20.

Next, as illustrated in FIG. 22, an arm 71 of the substrate transport mechanism supporting the substrate to be processed W from substrate carry in/out space 62A is inserted into a position between lifter pin 64L and cover ring 64R through the widely opened exhaust path 63C, and as illustrated in FIG. 23, the substrate to be processed W is separated from arm 71 by driving drive unit 641 to ascend lifter pin 64L.

Figure 24:
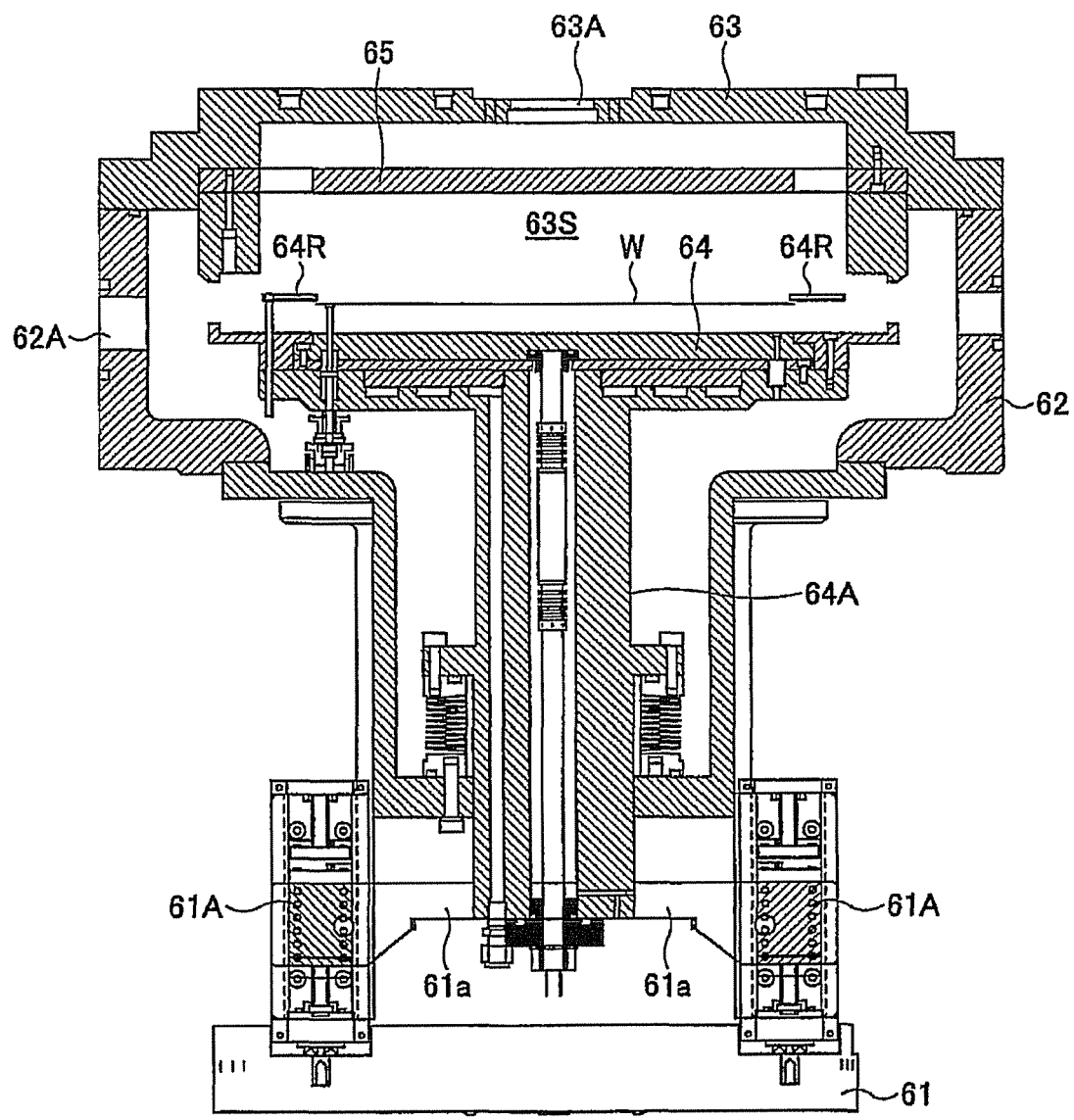
FIG. 24 is a fourth diagram illustrating a film forming procedure using the film forming apparatus of FIG. 20.

Also, as illustrated in FIG. 24, arm 70 is retreated from carry in/out space 62A and the gate valve (not shown) is closed.

Figure 25:
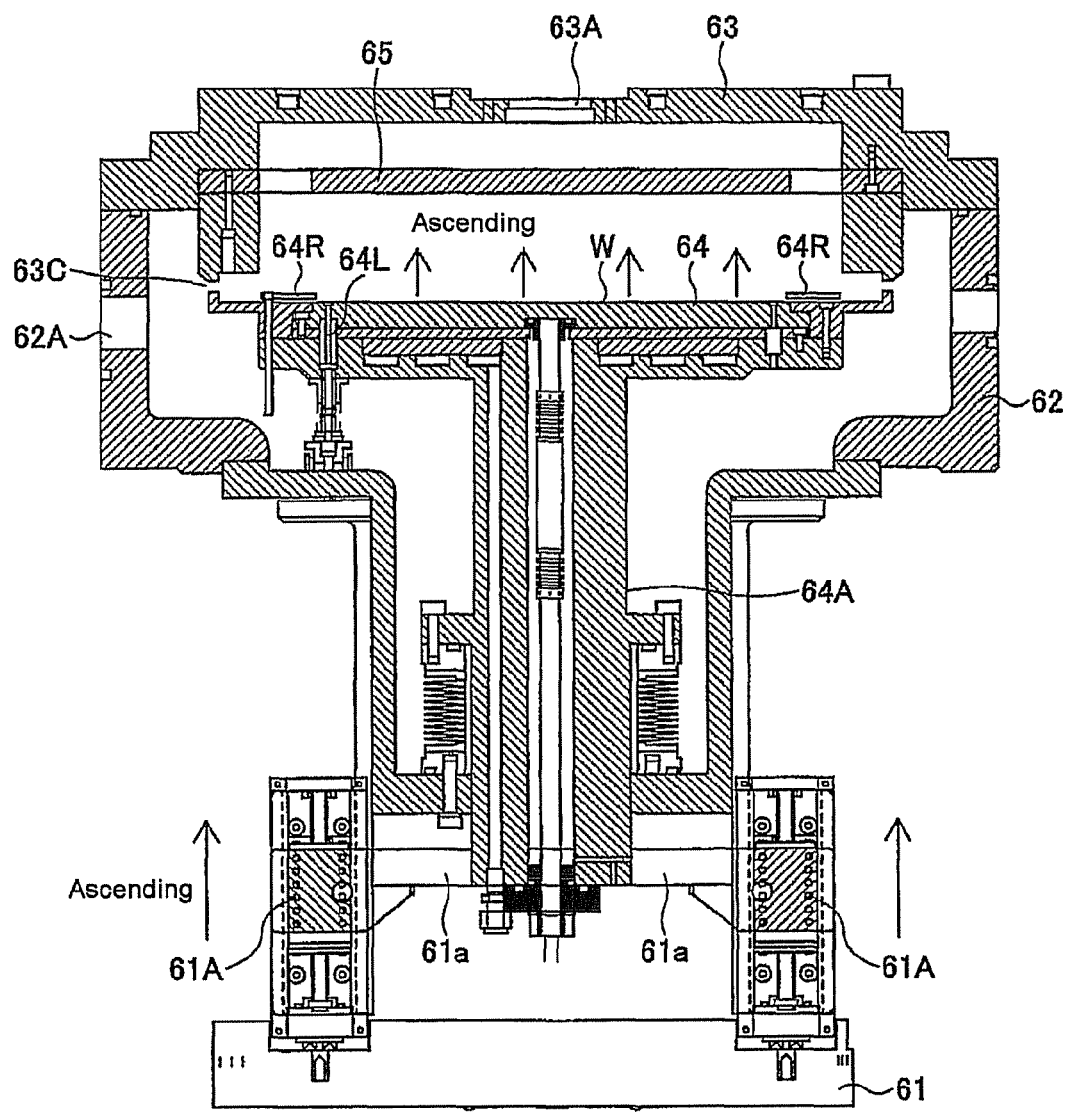
FIG. 25 is a fifth diagram illustrating a film forming procedure using the film forming apparatus of FIG. 20.

Next, as illustrated in FIG. 25, actuator 61A is driven and substrate holding plate 64 is elevated putting support unit 64A in between, and the substrate to be processed W supported on lifter pin 64L is supported by substrate holding plate 64. At this state, exhaust path 63C has a 10 mm width along the up/down direction.

Figure 26:
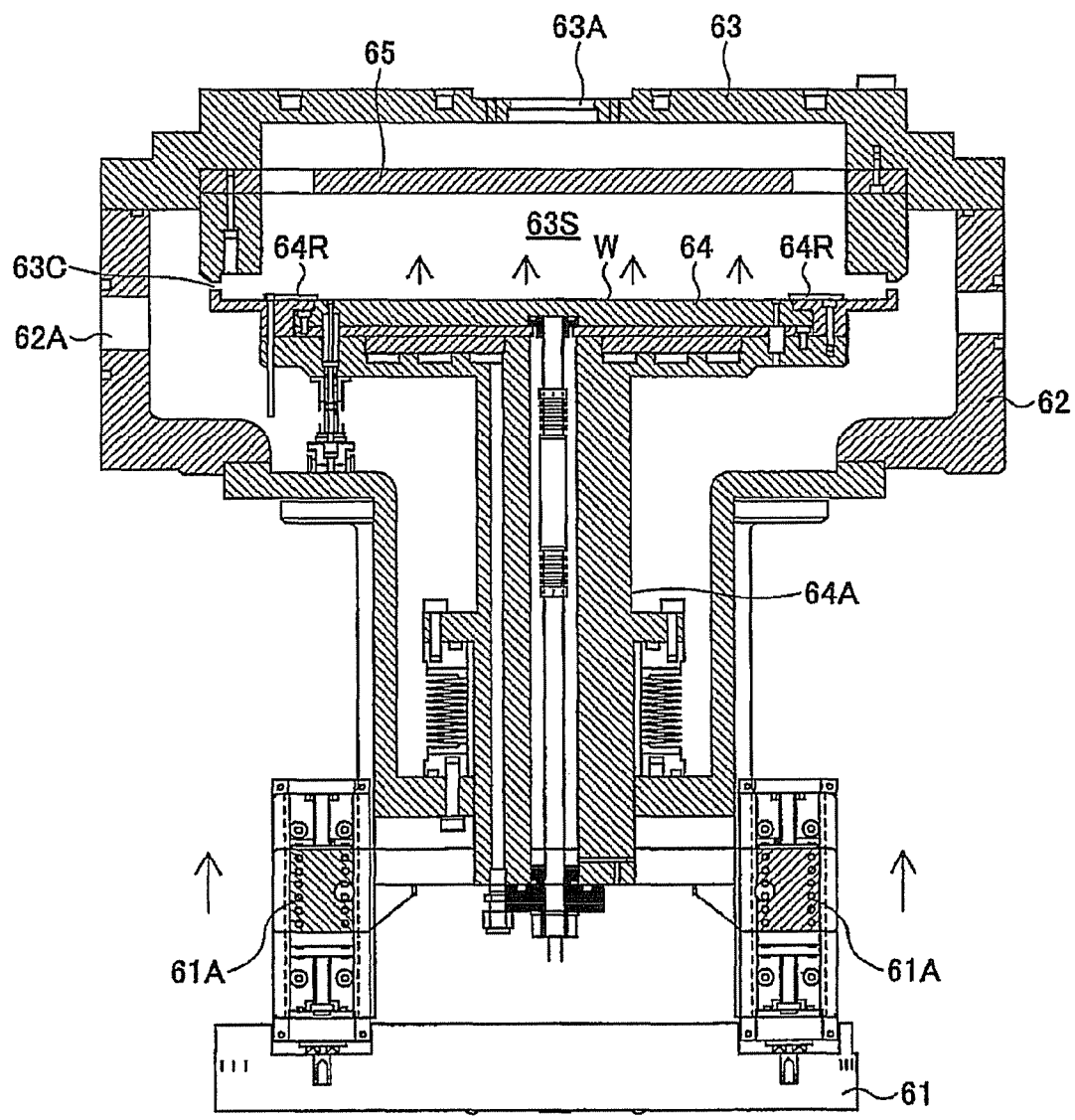
FIG. 26 a sixth diagram illustrating a film forming procedure using the film forming apparatus of FIG. 20.

Next, as illustrated in FIG. 26, actuator 61A is driven by a tiny amount, and substrate holding plate 64 is elevated by a tiny amount thereby setting the width of exhaust path 63C to be 8 mm. Also, at this state, cover ring 64R is combined to the side surface of the substrate to be processed W and maintained.

Figure 27:
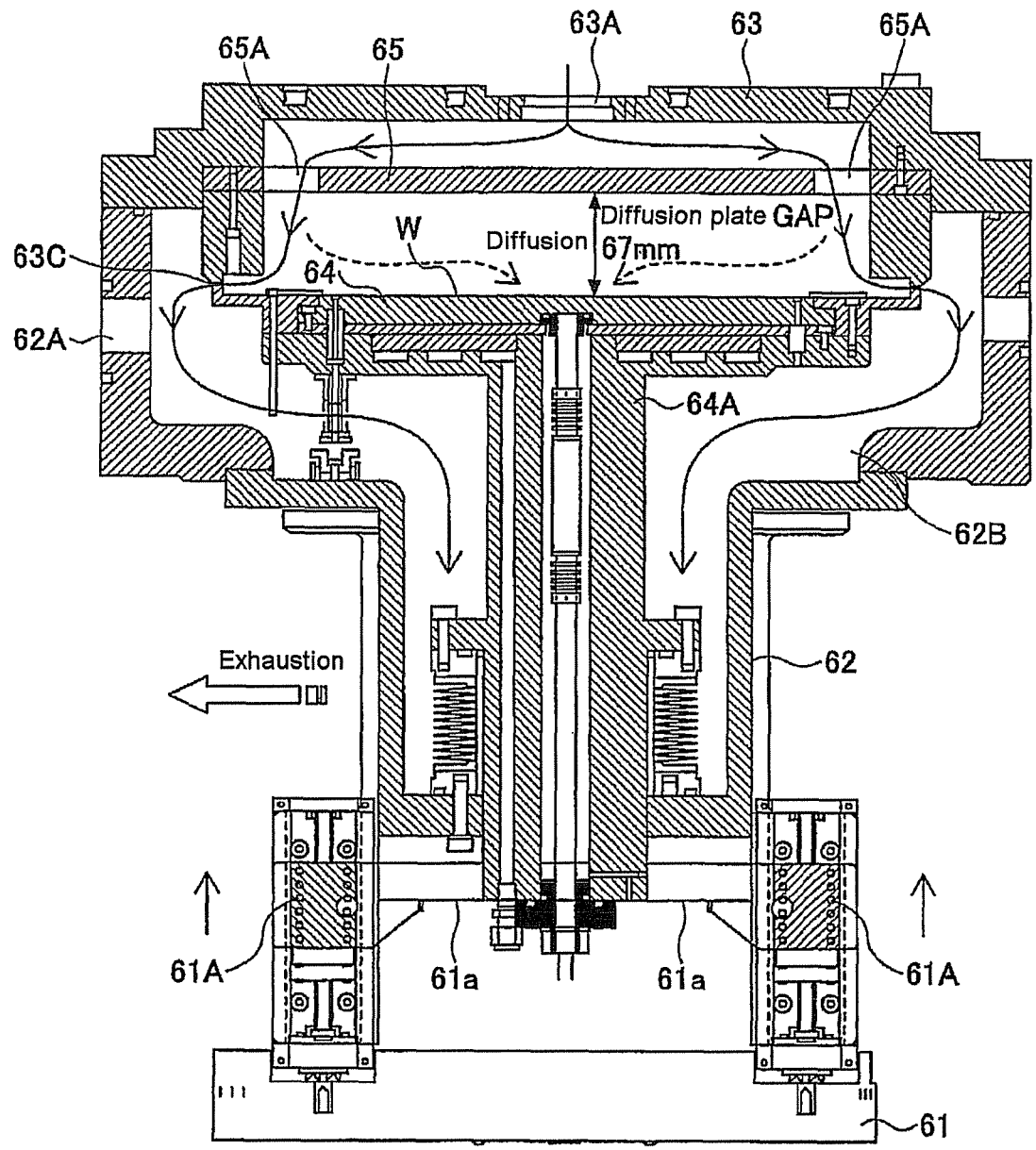
FIG. 27 is a seventh diagram illustrating a film forming procedure using the film forming apparatus of FIG. 20.

Also, in the process of FIG. 27, substrate holding plate 64 is elevated a little further by the driving of actuator 61A and the distance between baffle plate 65 and the substrate to be processed W is set to be 67 mm. Also, the up/down direction width of exhaust path 63C is set to be 2 mm, and the process gas containing $Ru_3(CO)_{12}$ gas and CO carrier gas is introduced from process gas introduce opening 63A. The introduced process gas is exhausted from opening 65A of the outer periphery of baffle plate 65 to exhaust path 63C. As a result, the Ru film is deposited with an identical rate in the surface of the substrate to be processed W out of the $Ru_3(CO)_{12}$ molecules diffused from the process gas flow, and the Ru film having an improved uniformity is deposited on the surface of the substrate to be processed W. Also, the process gas discharged from exhaust path 63C is exhausted from the exhaust pipe (not shown) through exhaust path 62B formed between outer chamber 62 and substrate holding plate 64, or between support unit 64A.

Figure 15:
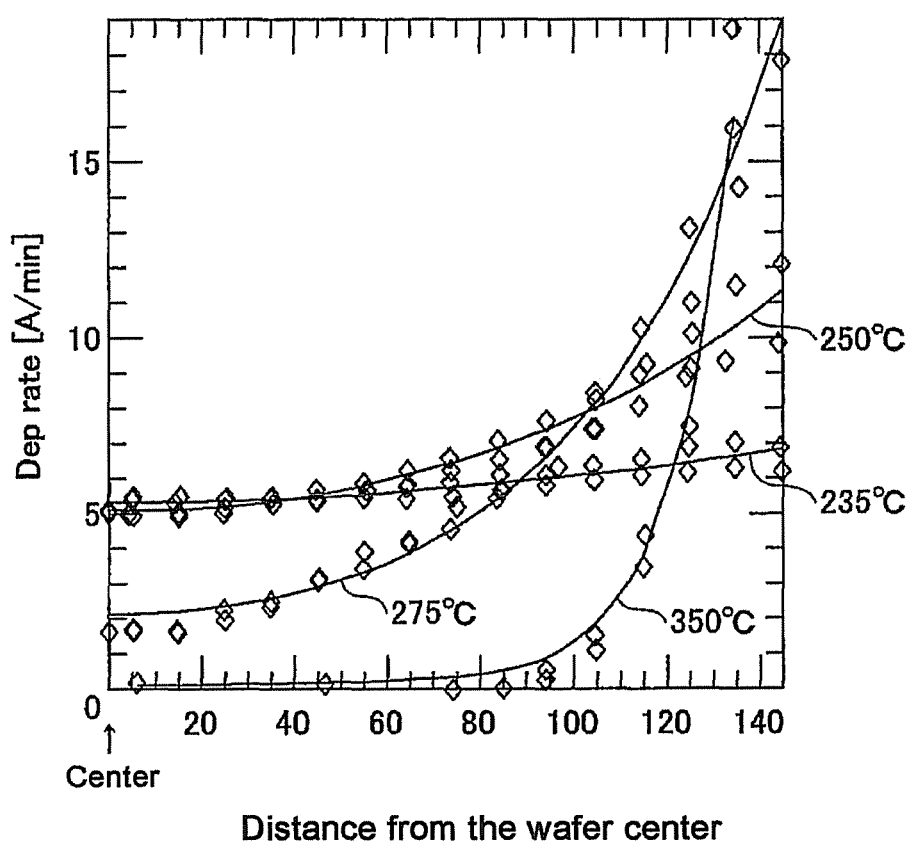
FIG. 15 is a graph illustrating the relationship between the uniformity of the Ru film thickness deposited on the substrate to be processed at various temperatures and the substrate temperature.
Figure 28:
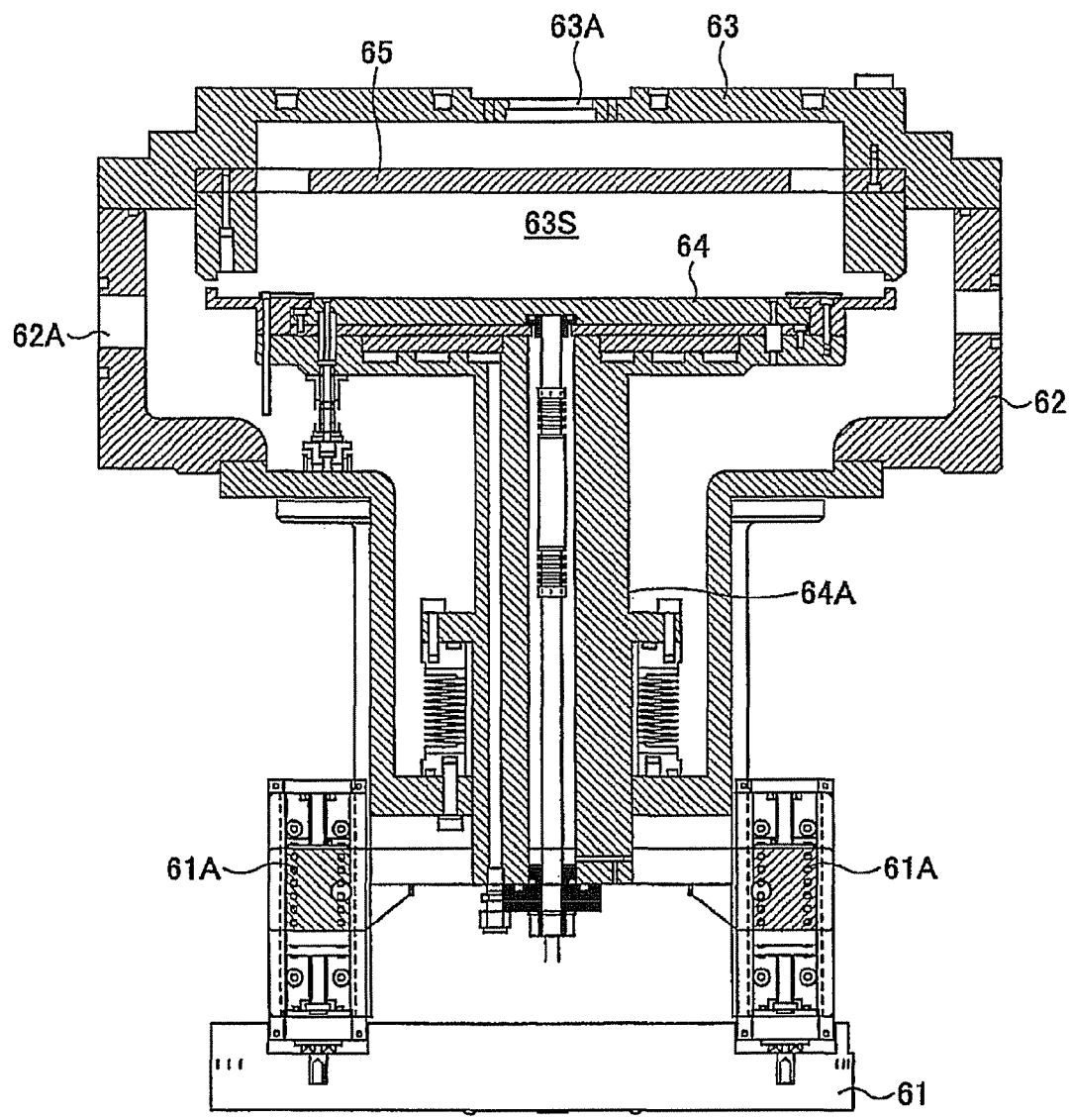
FIG. 28 is an eighth diagram illustrating a film forming procedure using the film forming apparatus of FIG. 20.

In the process of FIG. 27, by controlling the temperature of the substrate to be processed W with 200° C. or higher and 230° C. or lower, the preemptive Ru film deposition at the periphery of the substrate to be processed W is effectively suppressed by the CO gas and the problem of a selective deposition of the Ru film at the periphery of the substrate to be processed W, as described in FIG. 15, can be avoided After the process of FIG. 27, although the description is omitted, the substrate to be processed W is taken out by arm 71 of the substrate transport mechanism, the condition of film forming apparatus 60 is returned to the condition of FIG. 20 as illustrated in FIG. 28, and the inside of inner process chamber 63 is purged.

In the present embodiment, as for baffle plate 65, not only the baffle plate described in FIG. 11b and FIG. 11c but also the baffle plate described in FIG. 18 and FIG. 19 may be used.

Also, in the present embodiment, by flowing the cool/heat medium to cool/heat medium path 63B or 64B, the temperature of outer chamber 62 and inner process chamber 63 can be maintained at 80° C. and the deposition of the Ru film other than the substrate to be processed W can be suppressed.

As can be known from the above description, the present invention is not limited to the method of the Ru film formation in which $Ru_3(CO)_{12}$ gas is used as a base material and the CO gas is supplied along with, but may be effective to form other metal film such as W, Co, Os, Ir, Mn, Re, Mo by supplying the carbonyl base material along with the CO gas.

While preferred embodiments are described above, the present invention is not limited to the specific embodiments, but various modifications may be possible within the scope of the claims.

The present invention is based on and claims priority from Japanese Patent Application No. 2008-084551 filed on Mar. 27, 2008, the disclosure of which is incorporated herein in its entirety by reference.

The invention claimed is:

1. A film forming apparatus comprising:
a substrate holding plate configured to hold a substrate to be processed;
a process chamber that defines a process space with the substrate holding plate;
an exhaust path configured to exhaust the process space from an upper outside of an outer periphery of the substrate; and
a process gas supply channel provided above the substrate holding plate to face the substrate holding plate and configured to supply a process gas containing a raw gas and a carrier gas to the process space,
wherein the process gas supply channel, when the substrate holding plate is viewed from a vertical direction, includes a process gas introduce opening provided at a center portion of the process chamber to introduce the process gas in the process space; a process gas blocking member provided between the process gas introduce opening and the substrate holding plate, to block a direct pass of the process gas to an inside of the outer periphery of the substrate; and a process gas discharge opening provided at a periphery of the process gas blocking member to flow the process gas into the outside of the outer periphery of the substrate to the exhaust path in the process space and to not flow the process gas directly into the inside of the outer periphery of the substrate.

2. The film forming apparatus according to claim 1, wherein the process gas blocking member includes a plurality of process gas discharge openings formed above and along the outside of the outer periphery of the substrate, when viewed from a vertical direction.

3. The film forming apparatus of claim 2, wherein each of the plurality of process gas discharge openings extends along the outside of the outer periphery of the substrate.

4. The film forming apparatus of claim 2, wherein the plurality of process gas discharge openings form an opening row along the outside of the outer periphery of the substrate.

5. The film forming apparatus of claim 2, wherein the plurality of process gas discharge openings form a plurality of opening rows extending along the outside of the outer periphery of the substrate.

6. The film forming apparatus of claim 1, wherein the exhaust path is provided continuously in between the substrate holding plate and the process chamber.

7. The film forming apparatus of claim 6, wherein the substrate holding plate is maintained to be capable of being in proximity or separating with respect to the process chamber, and a conductance of the exhaust path varies with the substrate holding plate being in proximity or separating with respect to the process chamber.

8. The film forming apparatus of claim 1, wherein the raw gas contains a metal carbonyl and the carrier gas contains carbon monoxide.

9. The film forming apparatus of claim 8, wherein the substrate holding plate includes a heater controlled by a controller, and wherein the controller controls a temperature of the substrate holding plate such that the temperature of the substrate holding plate is maintained to be lower than a predetermined temperature.

10. The film forming apparatus of claim 9, wherein the controller controls the temperature of the substrate holding plate to be 230° C. or lower.

11. The film forming apparatus of claim 2, wherein the process gas blocking member further includes a flange portion maintained by the process chamber.

12. The film forming apparatus of claim 2, wherein an outer diameter of the process gas blocking member is larger than an outer diameter of the substrate to be processed.

* * * * *